(12) United States Patent
Komatsuzaki et al.

(10) Patent No.: US 12,176,856 B2
(45) Date of Patent: Dec. 24, 2024

(54) DOHERTY AMPLIFIER AND COMMUNICATION DEVICE

(71) Applicant: Mitsubishi Electric Corporation, Tokyo (JP)

(72) Inventors: Yuji Komatsuzaki, Tokyo (JP); Shuichi Sakata, Tokyo (JP); Shintaro Shinjo, Tokyo (JP); Hiroshi Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 591 days.

(21) Appl. No.: 17/488,498

(22) Filed: Sep. 29, 2021

(65) Prior Publication Data
US 2022/0021345 A1    Jan. 20, 2022

Related U.S. Application Data

(63) Continuation of application No. PCT/JP2019/017763, filed on Apr. 25, 2019.

(51) Int. Cl.
*H03F 1/02* (2006.01)
*H03F 1/56* (2006.01)
(Continued)

(52) U.S. Cl.
CPC ............ *H03F 1/0288* (2013.01); *H03F 1/56* (2013.01); *H03F 3/211* (2013.01);
(Continued)

(58) Field of Classification Search
CPC .......... H03F 1/0288; H03F 1/56; H03F 3/211; H03F 2200/222; H03F 2200/387;
(Continued)

(56) References Cited

U.S. PATENT DOCUMENTS 7,330,071 B1 * 2/2008 Dening ................. H03F 1/0288
                                                                  330/127
8,384,475 B2 * 2/2013 Gustavsson ............. H03F 3/602
                                                                  330/124 R
(Continued)

FOREIGN PATENT DOCUMENTS

JP      2006-191590 A      7/2006
JP      2015-89130 A       5/2015
WO    WO2014/094824 A1   6/2014

OTHER PUBLICATIONS

European Search Report issued Feb. 23, 2022 in European Patent Application No. 19 926 555.4.
(Continued)

*Primary Examiner* — Hieu P Nguyen
(74) *Attorney, Agent, or Firm* — Birch, Stewart, Kolasch & Birch, LLP

(57) ABSTRACT

A Doherty amplifier is configured to include a first transistor that amplifies a first signal and outputs the amplified first signal, a second transistor that amplifies a second signal and outputs the amplified second signal, and a combining circuit that combines the amplified first signal output from the first transistor and the amplified second signal output from the second transistor and outputs a combined signal of the amplified first signal and the amplified second signal, in which a signal mode in which the first signal amplified by the first transistor and the second signal amplified by the second transistor are combined in phase and a signal mode in which the first signal amplified by the first transistor and the second signal amplified by the second transistor are combined out of phase are switched in accordance with a frequency, and an operation mode is switched to a Doherty operation mode or an outphasing operation mode depending on the switched signal mode.

16 Claims, 15 Drawing Sheets

(51) Int. Cl.
*H03F 3/21* (2006.01)
*H04B 1/38* (2015.01)

(52) U.S. Cl.
CPC .. *H03F 2200/222* (2013.01); *H03F 2200/387* (2013.01); *H04B 1/38* (2013.01)

(58) Field of Classification Search
CPC .... H03F 1/0211; H03F 1/0261; H03F 1/0266; H03F 3/193; H03F 2200/451; H03F 1/0294; H04B 1/38
USPC ........................................ 330/295, 124 R, 84
See application file for complete search history.

(56) References Cited

U.S. PATENT DOCUMENTS

| | | |
|---|---|---|
| 9,882,535 B2 | 1/2018 | Jang et al. |
| 2004/0145416 A1 | 7/2004 | Kwon et al. |
| 2006/0145757 A1 | 7/2006 | Kim et al. |
| 2015/0116039 A1 | 4/2015 | Ahmed et al. |
| 2017/0373645 A1* | 12/2017 | Jang ........................ H03F 3/193 |

OTHER PUBLICATIONS

C. M. Andersson et al., "A 1-3-GHz Digitally Controlled Dual-RF Input Power-Amplifier Design Based on a Doherty-Outphasing Continuum Analysis", IEEE Transactions on Microwave Theory and Techniques, vol. 61, No. 10, Oct. 2013, pp. 3743-3752.
International Search Report issued in PCT/JP2019/017763, PCT/ISA/210, dated Jul. 23, 2019.
Japanese Office Action dated Jul. 7, 2020 in Japanese Patent Application No. 2019-560401, 8 pages.
Chinese Office Action and Search Report for Chinese Application No. 201980095564.9, dated Jun. 17, 2023, with English translation.

* cited by examiner

First Doherty Operation Mode

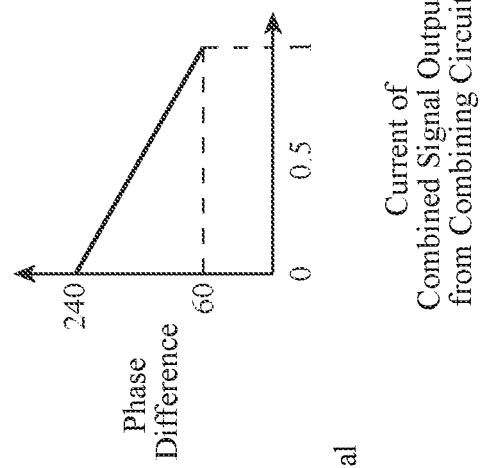
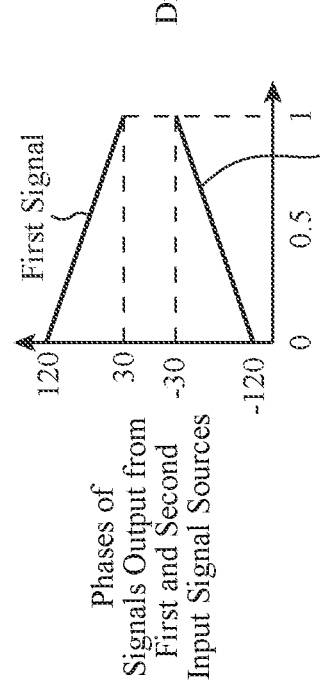
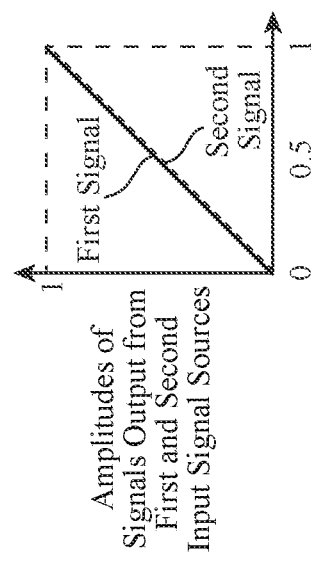

Second Outphasing Operation Mode

Third Doherty Operation Mode

DOHERTY AMPLIFIER AND COMMUNICATION DEVICE

CROSS REFERENCE TO RELATED APPLICATIONS

This application is a Continuation of PCT International Application No. PCT/JP2019/017763 filed on Apr. 25, 2019, which is hereby expressly incorporated by reference into the present application.

TECHNICAL FIELD

The present invention relates to a Doherty amplifier and a communication device.

BACKGROUND ART

In a general Doherty amplifier, a phase shift element is connected to an output side of a carrier amplifier, and a phase shift element is connected to an input side of a peak amplifier.

On the other hand, Patent Literature 1 below discloses a Doherty amplifier capable of matching each of amplitude and phase between an output signal of a carrier amplifier and an output signal of a peak amplifier.

In the Doherty amplifier disclosed in Patent Literature 1, a first phase adjuster is connected to a preceding stage of the carrier amplifier, and a second phase adjuster is connected to a preceding stage of the peak amplifier.

In the Doherty amplifier disclosed in Patent Literature 1, a first phase adjuster adjusts a phase of a signal input to the carrier amplifier, and a second phase adjuster adjusts a phase of a signal input to the peak amplifier.

In the Doherty amplifier disclosed in Patent Literature 1, when both the carrier amplifier and the peak amplifier are operating, the output power of the carrier amplifier and the output power of the peak amplifier are combined at a summing node.

CITATION LIST

Patent Literatures

Patent Literature 1: JP 2015-89130 A

SUMMARY OF INVENTION

Technical Problem

In the Doherty amplifier disclosed in Patent Literature 1, even if the frequency of the input signal changes, the impedance seeing the summing node from the carrier amplifier cannot be modulated. In addition, even if the frequency of the input signal changes, the impedance seeing the summing node from the peak amplifier cannot be modulated. Therefore, there is a problem that the amplification efficiency of the Doherty amplifier may be deteriorated.

The present invention has been made to solve the above problems, and an object of the present invention is to obtain a Doherty amplifier and a communication device capable of widening the bandwidth of efficiency characteristics at the time of back off even when a frequency of a first signal amplified by a first transistor and a frequency of a second signal amplified by a second transistor change.

Solution to Problem

A Doherty amplifier according to the present invention includes: a first transistor that amplifies a first signal and outputs the amplified first signal; a second transistor that amplifies a second signal and outputs the amplified second signal; a combining circuit that combines the amplified first signal output from the first transistor and the amplified second signal output from the second transistor and outputs a combined signal of the amplified first signal and the amplified second signal; and a signal source that switches between a signal mode in which the first signal amplified by the first transistor and the second signal amplified by the second transistor are combined in phase and a signal mode in which the first signal amplified by the first transistor and the second signal amplified by the second transistor are combined out of phase in accordance with a frequency, wherein an operation mode is switched to a Doherty operation mode or an outphasing operation mode depending on the switched signal mode, wherein an operation mode when an amplitude of the first signal amplified by the first transistor is equal to or larger than an amplitude of the second signal amplified by the second transistor, and a difference between a phase of the first signal amplified by the first transistor and a phase of the second signal amplified by the second transistor is constant is a first Doherty operation mode, and wherein an operation mode when an amplitude of the first signal amplified by the first transistor is the same as an amplitude of the second signal amplified by the second transistor, a phase of the first signal amplified by the first transistor is opposite to a phase of the second signal amplified by the second transistor, and a difference between the phase of the first signal amplified by the first transistor and the phase of the second signal amplified by the second transistor monotonically decreases with an increase in a current of a combined signal output from the combining circuit is a first outphasing operation mode.

Advantageous Effects of Invention

According to the present invention, a Doherty amplifier is configured such that a signal mode in which the first signal amplified by the first transistor and the second signal amplified by the second transistor are combined in phase and a signal mode in which the first signal amplified by the first transistor and the second signal amplified by the second transistor are combined out of phase are switched in accordance with a frequency, and an operation mode is switched to a Doherty operation mode or an outphasing operation mode depending on the switched signal mode. Therefore, the Doherty amplifier according to the present invention can widen the bandwidth of the efficiency characteristic at the time of back off even when the frequency of the first signal amplified by the first transistor and the frequency of the second signal amplified by the second transistor change.

BRIEF DESCRIPTION OF DRAWINGS

FIG. 7A is an explanatory diagram illustrating an amplitude of a first signal output from a first input signal source 12 and an amplitude of a second signal output from a second input signal source 13, FIG. 7B is an explanatory diagram illustrating a phase of the first signal output from the first input signal source 12 and a phase of the second signal output from the second input signal source 13, and FIG. 7C is an explanatory diagram illustrating a phase difference between the phase of the first signal output from the first input signal source 12 and the phase of the second signal output from the second input signal source 13.

DESCRIPTION OF EMBODIMENTS

Hereinafter, in order to explain this invention in more detail, embodiments for carrying out this invention will be described with reference to the accompanying drawings.

First Embodiment

Figure 1:
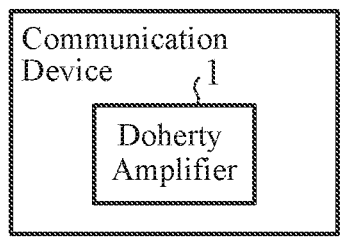
FIG. 1 is a configuration diagram illustrating a communication device including a Doherty amplifier 1 according to a first embodiment.

FIG. 1 is a configuration diagram illustrating a communication device including a Doherty amplifier 1 according to a first embodiment.

In FIG. 1, the Doherty amplifier 1 divides a communication signal into a first signal and a second signal, and amplifies each of the first signal and the second signal.

In the Doherty amplifier 1, a signal mode in which the first signal amplified by a first transistor 16 and the second signal amplified by a second transistor 20 are combined in phase and a signal mode in which the first signal amplified by the first transistor 16 and the second signal amplified by the second transistor 20 are combined out of phase are switched in accordance with a frequency.

In addition, the operation mode of the Doherty amplifier 1 is switched to a Doherty operation mode or an outphasing operation mode depending on the switched signal mode.

Figure 2:
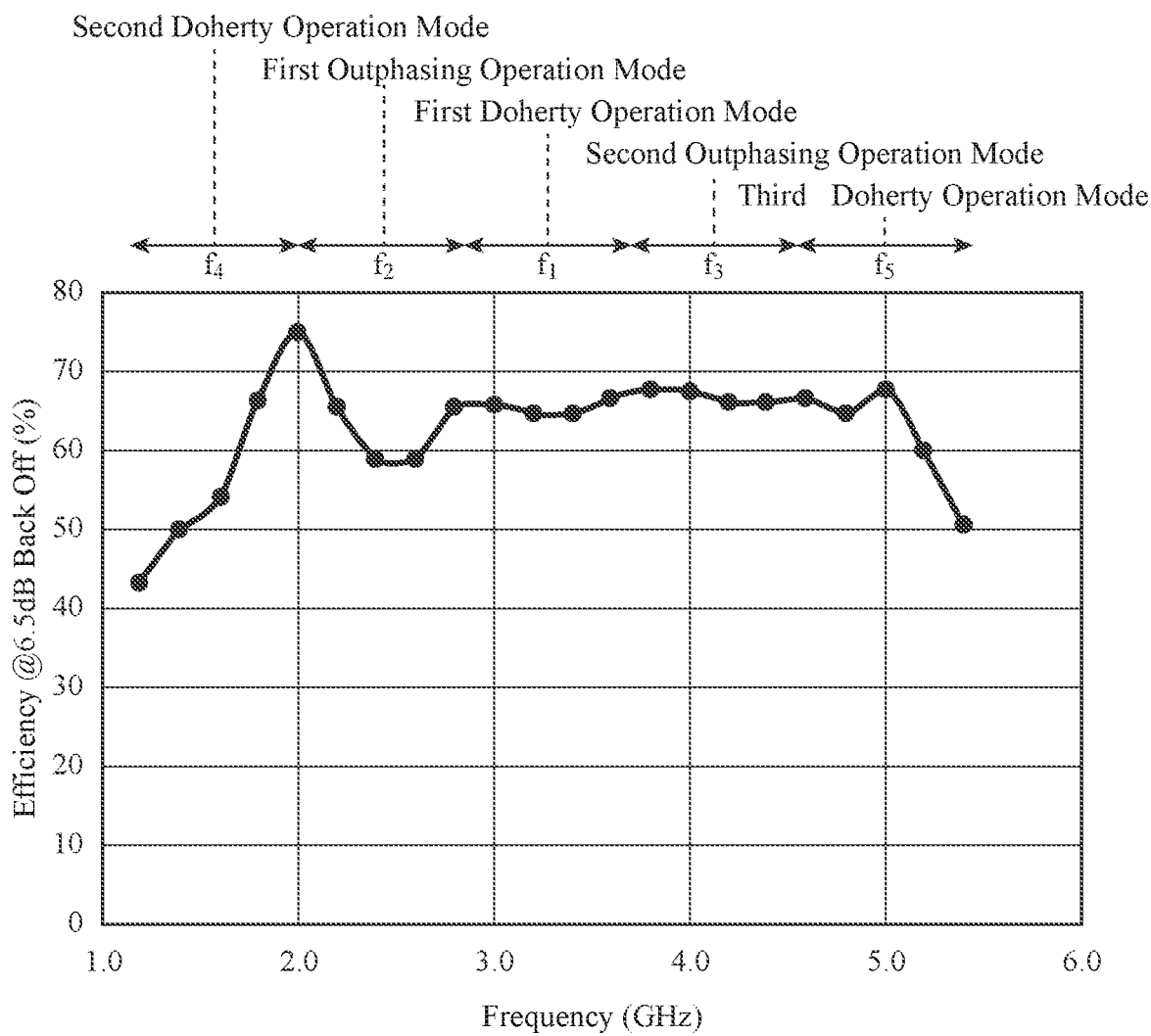
FIG. 2 is an explanatory diagram illustrating frequencies of a plurality of operation modes of the Doherty amplifier 1.

As illustrated in FIG. 2, the Doherty amplifier 1 has a first Doherty operation mode, a second Doherty operation mode, and a third Doherty operation mode as in-phase operation modes for operating as the Doherty amplifier.

Further, as illustrated in FIG. 2, the Doherty amplifier 1 has a first outphasing operation mode and a second outphasing operation mode as out-of-phase operation modes for operating as the outphasing amplifier.

FIG. 2 is an explanatory diagram illustrating frequencies of a plurality of operation modes of the Doherty amplifier 1.

The operation mode of the Doherty amplifier 1 is determined by the frequency of the first signal output from a first input signal source 12 and the frequency of the second signal output from a second input signal source 13. The first input signal source 12 and the second input signal source 13 will be described later.

The first Doherty operation mode is an operation mode when each of the frequency of the first signal output from the first input signal source 12 and the frequency of the second signal output from the second input signal source 13 is a first frequency $f_1$. In the example of FIG. 2, a frequency in the range of about 2.8 [GHz] to about 3.7 [GHz] is the first frequency $f_1$. However, this is merely an example, and the frequency range including the first frequency $f_1$ may be a range different from the range of about 2.8 [GHz] to about 3.7 [GHz].

The first outphasing operation mode is an operation mode when each of the frequency of the first signal output from the first input signal source 12 and the frequency of the second signal output from the second input signal source 13 is a second frequency $f_2$ lower than the first frequency $f_1$. In the example of FIG. 2, a frequency in the range of about 2.0 [GHz] to about 2.8 [GHz] is the second frequency $f_2$. However, this is merely an example, and the frequency range including the second frequency $f_2$ may be a range different from the range of about 2.0 [GHz] to about 2.8 [GHz].

The second outphasing operation mode is an operation mode when each of the frequency of the first signal output from the first input signal source 12 and the frequency of the second signal output from the second input signal source 13 is a third frequency $f_3$ higher than the first frequency $f_1$. In the example of FIG. 2, a frequency in the range of about 3.7 [GHz] to about 4.5 [GHz] is the third frequency $f_3$. However, this is merely an example, and the frequency range including the third frequency $f_3$ may be a range different from the range of about 3.7 [GHz] to about 4.5 [GHz].

The second Doherty operation mode is an operation mode when each of the frequency of the first signal output from the first input signal source 12 and the frequency of the second signal output from the second input signal source 13 is a fourth frequency $f_4$ lower than the second frequency $f_2$. In the example of FIG. 2, a frequency in the range of about 1.2 [GHz] to about 2.0 [GHz] is the fourth frequency $f_4$. However, this is merely an example, and the frequency range including the fourth frequency $f_4$ may be a range different from the range of about 1.2 [GHz] to about 2.0 [GHz].

The third Doherty operation mode is an operation mode when each of the frequency of the first signal output from the first input signal source 12 and the frequency of the second signal output from the second input signal source 13 is a fifth frequency $f_5$ higher than the third frequency $f_3$. In the example of FIG. 2, a frequency in the range of about 4.5 [GHz] to about 5.4 [GHz] is the fifth frequency $f_5$. However, this is merely an example, and the frequency range including the fifth frequency $f_5$ may be a range different from the range of about 4.5 [GHz] to about 5.4 [GHz].

Each operation mode of the Doherty amplifier 1 includes, as the operation of each of the first transistor 16 and the second transistor 20, a saturated output-time operation when the output power of both the first transistor 16 and the second transistor 20 is a saturated power. The first transistor 16 and the second transistor 20 will be described later.

In addition, each operation mode of the Doherty amplifier 1 includes, as the operation of each of the first transistor 16 and the second transistor 20, a back off-time operation when the output power of both the first transistor 16 and the second transistor 20 is equal to or less than the saturated power.

In the back off-time operation included in each of the first Doherty operation mode, the second Doherty operation mode, and the third Doherty operation mode, only one of the first transistor 16 and the second transistor 20 operates and the other stops the operation.

In the back off-time operation included in each of the first outphasing operation mode and the second outphasing operation mode, both the first transistor 16 and the second transistor 20 operate.

FIG. 2 illustrates frequencies of the respective operation modes of the Doherty amplifier 1, and also illustrates efficiencies of the Doherty amplifier 1 during the back off-time operation included in the respective operation modes.

Figure 3:
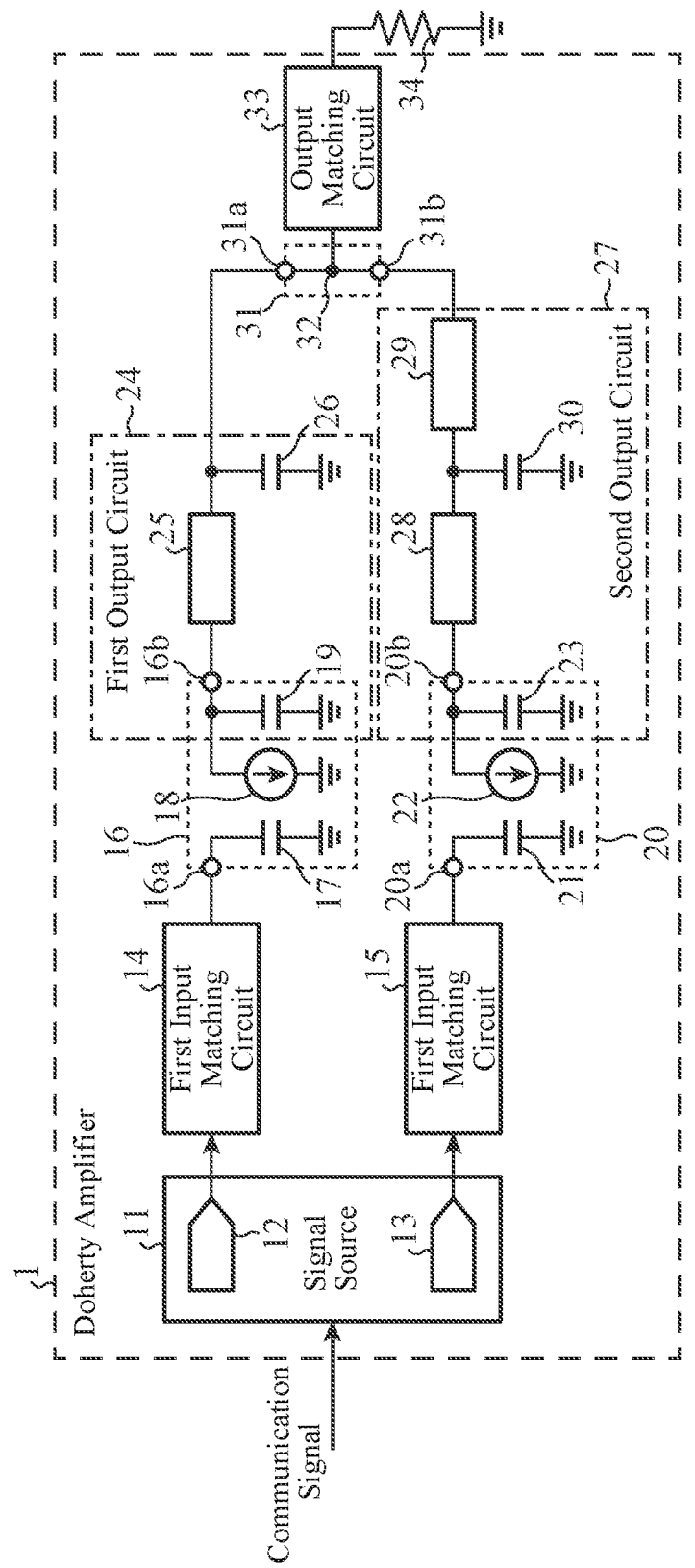
FIG. 3 is a configuration diagram illustrating the Doherty amplifier 1 according to the first embodiment.

FIG. 3 is a configuration diagram illustrating the Doherty amplifier 1 according to the first embodiment.

In FIG. 3, a signal source 11 includes the first input signal source 12 and the second input signal source 13.

The signal source 11 divides the communication signal input to the signal source 11 into two signals.

The signal source 11 outputs one of the two signals to the first input signal source 12 and outputs the other signal to the second input signal source 13.

The first input signal source 12 is implemented by, for example, a quadrature modulator, a digital analog converter (DAC), and a direct digital synthesizer (DDS).

The first input signal source 12 determines each of the amplitude and the phase depending on the operation mode of the Doherty amplifier 1, and outputs a signal of a voltage having each of the determined amplitude and phase as a first signal to the first transistor 16 via a first input matching circuit 14. The first signal includes the same information as information included in one signal.

The second input signal source 13 is implemented by, for example, a quadrature modulator, a DAC, and a DDS.

The second input signal source 13 determines each of the amplitude and the phase depending on the operation mode of the Doherty amplifier 1, and outputs a signal of a voltage having each of the determined amplitude and phase as a second signal to the second transistor 20 via a second input matching circuit 15. The second signal includes the same information as information included in the other signal.

Each of the first input matching circuit 14 and the second input matching circuit 15 is implemented by, for example, a circuit using a lumped constant element, a circuit using a distributed constant line, a circuit in which a lumped constant and a distributed constant are combined, an L-C type matching circuit using a coil and a capacitor, or a quarter-wavelength line.

One end of the first input matching circuit 14 is connected to the first input signal source 12, and the other end of the first input matching circuit 14 is connected to an input terminal 16a of the first transistor 16.

The first input matching circuit 14 converts the impedance of the first input signal source 12 into the input impedance of the first transistor 16, and outputs the first signal output from the first input signal source 12 to the input terminal 16a of the first transistor 16.

One end of the second input matching circuit 15 is connected to the second input signal source 13, and the other end of the second input matching circuit 15 is connected to an input terminal 20a of the second transistor 20.

The second input matching circuit 15 converts the impedance of the second input signal source 13 into the input impedance of the second transistor 20, and outputs the second signal output from the second input signal source 13 to the input terminal 20a of the second transistor 20.

The first transistor 16 is implemented by, for example, a field effect transistor (FET), a heterojunction bipolar transistor (HBT), or a high electron mobility transistor (HEMT).

In the Doherty amplifier 1 illustrated in FIG. 3, an example in which the first transistor 16 is a source-grounded transistor is illustrated. A gate terminal which is the input terminal 16a of the first transistor 16 is connected to the other end of the first input matching circuit 14, and a drain terminal which is an output terminal 16b of the first transistor 16 is connected to one end of a first transmission line 25 in a first output circuit 24. The first output circuit 24 will be described later.

In the first transistor 16, an in phase in which it is operated as a Doherty amplifier and an out of phase in which it is operated as an outphasing amplifier are switched in accordance with the frequency.

The first transistor 16 amplifies the first signal output from the first input signal source 12 via the first input matching circuit 14, and outputs the amplified first signal to the first transmission line 25 of the first output circuit 24.

A bias voltage substantially the same as the threshold voltage is applied to the input terminal 16a of the first transistor 16. The first transistor 16 performs a signal amplification operation when the voltage of the input terminal 16a is larger than the threshold voltage, and does not perform the signal amplification operation when the voltage of the input terminal 16a is equal to or lower than the threshold voltage.

Therefore, it is possible to switch the operation of the first transistor 16 depending on the presence or absence of the first signal with respect to the input terminal 16a of the first transistor 16.

When the first transistor 16 is represented by an equivalent circuit, the first transistor 16 can be represented by a capacitor 17 having an input capacitance, a current source 18, and a capacitor 19 having an output capacitance.

The second transistor 20 is implemented by, for example, an FET, an HBT, or an HEMT.

In the Doherty amplifier 1 illustrated in FIG. 3, an example is illustrated in which the second transistor 20 is a source-grounded transistor. A gate terminal which is the input terminal 20a of the second transistor 20 is connected to the other end of the second input matching circuit 15, and a drain terminal which is an output terminal 20b of the second transistor 20 is connected to one end of a second transmission line 28 in the second output circuit 27. The second output circuit 27 will be described later.

In the second transistor 20, an in phase in which it is operated as a Doherty amplifier and an out of phase in which it is operated as an outphasing amplifier are switched in accordance with the frequency.

The second transistor 20 amplifies the second signal output from the second input signal source 13 via the second input matching circuit 15, and outputs the amplified second signal to the second transmission line 28 of the second output circuit 27.

A bias voltage substantially the same as the threshold voltage is applied to the input terminal 20a of the second transistor 20. The second transistor 20 performs the signal amplification operation when the voltage of the input terminal 20a is larger than the threshold voltage, and does not perform the signal amplification operation when the voltage of the input terminal 20a is equal to or lower than the threshold voltage.

Therefore, it is possible to switch the operation of the second transistor 20 depending on the presence or absence of the second signal with respect to the input terminal 20a of the second transistor 20.

When the second transistor 20 is represented by an equivalent circuit, the second transistor 20 can be represented by a capacitor 21 having an input capacitance, a current source 22, and a capacitor 23 having an output capacitance.

The first output circuit 24 includes the capacitor 19, the first transmission line 25, and a first capacitor 26.

In the Doherty amplifier 1 illustrated in FIG. 3, the first transistor 16 and the first output circuit 24 are drawn so as to share the capacitor 19 having the output capacitance of the first transistor 16. However, for convenience of description, this is merely drawn so as to be shared, and the first output circuit 24 may include only the first transmission line 25 and the first capacitor 26 without sharing the capacitor 19 with the first transistor 16.

The first output circuit 24 transmits the first signal output from the first transistor 16 and outputs the first signal to a combining circuit 31.

The first output circuit 24 modulates the impedance seeing the combining circuit 31 from the first transistor 16 in accordance with the frequency of the first signal amplified by the first transistor 16.

The electrical length of the first output circuit 24 changes in accordance with the frequency of the first signal. For example, when the frequency of the first signal is a center frequency $f_0$ of the frequency range including the first frequency $f_1$, the electrical length of the first output circuit 24 is 90 degrees. The electrical length of the first output circuit 24 is not limited to the one exactly matching the electrical length of 90 degrees, and may be deviated from the electrical length of 90 degrees as long as there is no practical problem.

One end of the first transmission line 25 is connected to the output terminal 16b of the first transistor 16, and the other end of the first transmission line 25 is connected to each of the input terminal 31a of the combining circuit 31 and one end of the first capacitor 26.

The first transmission line 25 is, for example, a line having an electrical length of less than 90 degrees when the frequency of the first signal is the first frequency $f_1$.

The characteristic impedance of the first transmission line 25 is higher than the output resistance of the first transistor 16.

The first capacitor 26 is connected to the first transmission line 25 and the shunt. That is, one end of the first capacitor 26 is connected to each of the other end of the first transmission line 25 and the input terminal 31a of the combining circuit 31, and the other end of the first capacitor 26 is connected to the ground.

The capacitance of the first capacitor 26 is the same as the capacitance of the capacitor 19 which is the output capacitance of the first transistor 16. However, the capacitance of the first capacitor 26 is not limited to the one exactly matching the capacitance of the capacitor 19, and may be different from the capacitance of the capacitor 19 as long as there is no practical problem.

The second output circuit 27 includes a capacitor 23, a second transmission line 28, a third transmission line 29, and a second capacitor 30.

In the Doherty amplifier 1 illustrated in FIG. 3, the second transistor 20 and the second output circuit 27 are drawn so as to share the capacitor 23 having the output capacitance of the second transistor 20. However, for convenience of description, this is merely drawn so as to be shared, and the second output circuit 27 may include only the second transmission line 28, the third transmission line 29, and the second capacitor 30 without sharing the capacitor 23 with the second transistor 20.

The second output circuit 27 has an electrical length longer than the electrical length of the first transmission line 25, transmits the second signal output from the second transistor 20, and outputs the second signal to the combining circuit 31.

The second output circuit 27 modulates the impedance seeing the combining circuit 31 from the second transistor 20 in accordance with the frequency of the second signal amplified by the second transistor 20.

The electrical length of the second output circuit 27 changes in accordance with the frequency of the second signal. For example, when the frequency of the second signal is the center frequency $f_0$ of the frequency range including the first frequency the electrical length of the second output circuit 27 is 180 degrees. However, the electrical length of the second output circuit 27 is not limited to the one exactly matching the electrical length of 180 degrees, and may be deviated from the electrical length of 180 degrees as long as there is no practical problem.

One end of the second transmission line 28 is connected to the output terminal 20b of the second transistor 20, and the other end of the second transmission line 28 is connected to each of one end of the third transmission line 29 and one end of the second capacitor 30.

The second transmission line 28 is, for example, a line having an electrical length of less than 90 degrees when the frequency of the second signal is the first frequency $f_1$.

The characteristic impedance of the second transmission line 28 is higher than the output resistance of the second transistor 20.

One end of the third transmission line 29 is connected to each of the other end of the second transmission line 28 and one end of the second capacitor 30, and the other end of the third transmission line 29 is connected to the input terminal 31b of the combining circuit 31.

The third transmission line 29 is, for example, a line having an electrical length of 90 degrees when the frequency of the second signal is the center frequency $f_0$. However, the electrical length of the third transmission line 29 is not limited to the one exactly matching the electrical length of 90 degrees, and may be deviated from the electrical length of 90 degrees as long as there is no practical problem.

The characteristic impedance of the third transmission line 29 is the same as the output resistance of the second transistor 20. However, the characteristic impedance of the third transmission line 29 is not limited to the one exactly matching the output resistance of the second transistor 20, and may be different from the output resistance of the second transistor 20 as long as there is no practical problem.

The second capacitor 30 is connected to the second transmission line 28 and the shunt. That is, one end of the second capacitor 30 is connected to each of the other end of the second transmission line 28 and one end of the third transmission line 29, and the other end of the second capacitor 30 is connected to the ground.

The capacitance of the second capacitor 30 is the same as the capacitance of the capacitor 23 which is the output capacitance of the second transistor 20. However, the capacitance of the second capacitor 30 is not limited to the one exactly matching the capacitance of the capacitor 23, and may be different from the capacitance of the capacitor 23 as long as there is no practical problem.

The combining circuit 31 includes a combining point 32 that combines the first signal transmitted by the first output circuit 24 and the second signal transmitted by the second output circuit 27.

The input terminal 31a of the combining circuit 31 is connected to each of the other end of the first transmission line 25 and one end of the first capacitor 26.

The input terminal 31b of the combining circuit 31 is connected to the other end of the third transmission line 29.

The combining circuit 31 combines the first signal output from the first output circuit 24 and the second signal output from the second output circuit 27.

The combining point 32 is a combining point of the first signal output from the first output circuit 24 and the second signal output from the second output circuit 27. If a combining point is included, the circuit is referred to as a combining circuit.

Here, the in phase means that the first signal transmitted by the first output circuit 24 and the second signal transmitted by the second output circuit 27 are combined in phase at the combining point 32. For example, even if the first signal input to the first transistor 16 and the second signal input to the second transistor 20 have different phases at the input end face, if the first signal transmitted by the first output circuit 24 and having a phase changed and the second signal transmitted by the second output circuit 27 and having a phase changed have the same phase at the combining point 32, they are in phase. The out of phase means that the first signal transmitted by the first output circuit 24 and the second signal transmitted by the second output circuit 27 are combined out of phase at the combining point 32. For example, even if the first signal input to the first transistor 16 and the second signal input to the second transistor 20 are in phase at the input end face, if the first signal transmitted by the first output circuit 24 and having a phase changed and the second signal transmitted by the second output circuit 27 and having a phase changed have different phases at the combining point 32, they are out of phase.

An output matching circuit 33 is implemented by, for example, a circuit using a lumped constant element, a circuit using a distributed constant line, a circuit in which a lumped constant and a distributed constant are combined, an L-C type matching circuit using a coil and a capacitor, or a quarter-wavelength line.

One end of the output matching circuit 33 is connected to the combining point 32, and the other end of the output matching circuit 33 is connected to an external load 34 of the Doherty amplifier 1.

The output matching circuit 33 is a circuit that matches the impedance of the combining point 32 with the impedance of the load 34.

The load 34 is an external load of the Doherty amplifier 1 connected to the other end of the output matching circuit 33.

The Doherty amplifier 1 illustrated in FIG. 3 includes the output matching circuit 33. However, this is merely an example, and as long as each of the first output circuit 24 and the second output circuit 27 has a matching function with the impedance of the load 34, the Doherty amplifier 1 may not include the output matching circuit 33.

Next, an operation of the Doherty amplifier 1 illustrated in FIG. 3 will be described.

In the first embodiment, for convenience of description, it is assumed that the frequency of the input communication signal is the first frequency $f_1$ or the second frequency $f_2$.

Therefore, in the first embodiment, it is assumed that the Doherty amplifier illustrated in FIG. 3 operates in the first Doherty operation mode or the first outphasing operation mode.

First, an outline of an operation of the Doherty amplifier 1 will be described.

The signal source 11 divides the communication signal input to the signal source 11 into two signals.

The signal source 11 outputs one of the two signals to the first input signal source 12 and outputs the other signal to the second input signal source 13.

The first input signal source 12 determines the operation mode of the Doherty amplifier 1 to be the first Doherty operation mode when the frequency of one signal is the first frequency $f_1$, and determines the operation mode of the Doherty amplifier 1 to be the first outphasing operation mode when the frequency of one signal is the second frequency $f_2$.

The first input signal source 12, when determining the operation mode of the Doherty amplifier 1 to be the first Doherty operation mode, outputs a signal of a voltage having an amplitude and a phase corresponding to the first Doherty operation mode to the first transistor 16 via the first input matching circuit 14 as a first signal.

The first input signal source 12, when determining the operation mode of the Doherty amplifier 1 to be the first outphasing operation mode, outputs a signal of a voltage having an amplitude and a phase corresponding to the first outphasing operation mode to the first transistor 16 via the first input matching circuit 14 as a first signal.

Note that the first signal includes the same information as the information included in one signal.

The second input signal source 13 determines the operation mode of the Doherty amplifier 1 to be the first Doherty operation mode when the frequency of the other signal output from the signal source 11 is the first frequency $f_1$, and determines the operation mode of the Doherty amplifier 1 to be the first outphasing operation mode when the frequency is the second frequency $f_2$.

The second input signal source 13, when determining the operation mode of the Doherty amplifier 1 to be the first Doherty operation mode, outputs a signal of a voltage having an amplitude and a phase corresponding to the first Doherty operation mode to the second transistor 20 via the second input matching circuit 15 as a second signal.

The second input signal source 13, when determining the operation mode of the Doherty amplifier 1 to be the first outphasing operation mode, outputs a signal of a voltage having an amplitude and a phase corresponding to the first outphasing operation mode to the second transistor 20 via the second input matching circuit 15 as a second signal.

Note that the second signal includes the same information as the information included in the other signal.

The first transistor 16, when receiving the first signal output from the first input signal source 12 via the first input matching circuit 14, amplifies the first signal and outputs the amplified first signal to the first transmission line 25 in the first output circuit 24.

The second transistor 20, when receiving the second signal output from the second input signal source 13 via the second input matching circuit 15, amplifies the second signal and outputs the amplified second signal to the second transmission line 28 in the second output circuit 27.

When the first signal is output from the output terminal 16*b* of the first transistor 16, the first output circuit 24 transmits the first signal and outputs the first signal to the combining circuit 31.

When the second signal is output from the output terminal 20*b* of the second transistor 20, the second output circuit 27 transmits the second signal and outputs the second signal to the combining circuit 31.

The combining circuit 31 combines the first signal transmitted by the first output circuit 24 and the second signal transmitted by the second output circuit 27.

The combining circuit 31 outputs a combined signal of the first signal and the second signal to the external load 34 via the output matching circuit 33.

Next, the saturated output-time operation of the Doherty amplifier 1 in the first Doherty operation mode and the back off-time operation of the Doherty amplifier 1 in the first Doherty operation mode will be specifically described.

Here, for convenience of description, it is assumed that each of the output resistance of the first transistor 16 and the output resistance of the second transistor 20 is Ropt.

In addition, it is assumed that each of the characteristic impedance of the first output circuit 24 and the characteristic impedance of the second output circuit 27 is Ropt.

In addition, it is assumed that the impedance seeing the load 34 from the combining point 32 is 0.5×Ropt.

In the first Doherty operation mode, each of the frequency of the first signal and the frequency of the second signal is the first frequency $f_1$. When each of the frequency of the first signal and the frequency of the second signal is the center frequency $f_0$ of the frequency range including the first frequency $f_1$, the electrical length of the first output circuit 24 is about 90 degrees, and the electrical length of the second output circuit 27 is about 180 degrees.

Hereinafter, an example in which the first frequency $f_1$ is the center frequency $f_0$ will be described.

FIG. 4 is an explanatory diagram illustrating a first signal and a second signal in the first Doherty operation mode.

Figure 4C:
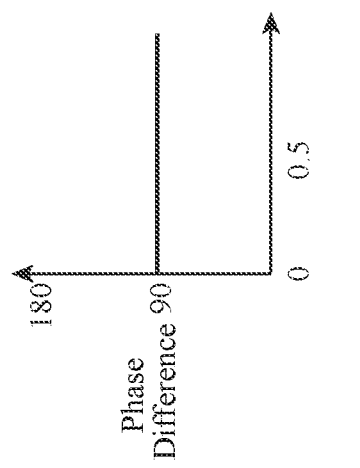
FIG. 4C is an explanatory diagram illustrating a phase difference between the phase of the first signal output from the first input signal source 12 and the phase of the second signal output from the second input signal source 13.
Figure 4B:
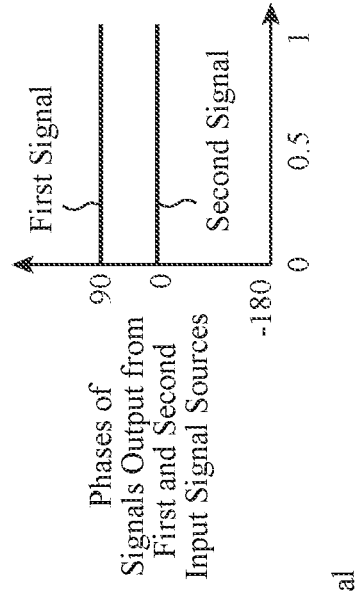
FIG. 4B is an explanatory diagram illustrating a phase of the first signal output from the first input signal source 12 and a phase of the second signal output from the second input signal source 13.
Figure 4A:
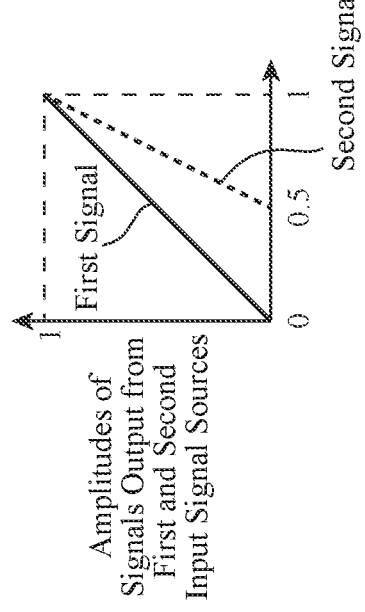
FIG. 4A is an explanatory diagram illustrating an amplitude of a first signal output from a first input signal source 12 and an amplitude of a second signal output from a second input signal source 13.

FIG. 4A illustrates an amplitude of the first signal output from the first input signal source 12 and an amplitude of the second signal output from the second input signal source 13.

FIG. 4B illustrates a phase of the first signal output from the first input signal source 12 and a phase of the second signal output from the second input signal source 13.

FIG. 4C illustrates a phase difference between the phase of the first signal output from the first input signal source 12 and the phase of the second signal output from the second input signal source 13. The phase difference is a value obtained by subtracting the phase of the second signal output from the second input signal source 13 from the phase of the first signal output from the first input signal source 12.

The horizontal axis in each of FIGS. 4A, 4B, and 4C represents a voltage of the combined signal output from the combining circuit 31. The voltage is a normalized voltage.

[Saturated Output-Time Operation of Doherty Amplifier 1 in First Doherty Operation Mode]

The saturated output-time operation of the Doherty amplifier 1 in the first Doherty operation mode will be described.

The first input signal source 12 outputs, as a first signal, a signal in which the output power of the first transistor 16 is a saturated power to the first input matching circuit 14.

Specifically, as illustrated in FIGS. 4A and 4B, the first input signal source 12 outputs, to the first input matching circuit 14, a first signal having an amplitude at which the voltage of the combined signal output from the combining circuit 31 is "1" and having a phase of about 90 degrees.

The second input signal source 13 outputs, as a second signal, a signal in which the output power of the second transistor 20 is a saturated power to the second input matching circuit 15.

Specifically, as illustrated in FIGS. 4A and 4B, the second input signal source 13 outputs, to the second input matching circuit 15, a second signal having an amplitude at which the voltage of the combined signal output from the combining circuit 31 is "1" and having a phase of about 0 degrees.

The first input matching circuit 14, when receiving the first signal from the first input signal source 12, converts the impedance of the first input signal source 12 into the input impedance of the first transistor 16, and outputs the first signal to the input terminal 16*a* of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the saturated output-time operation, both the first transistor 16 and the second transistor 20 perform signal amplification operation, and the phase of the first signal output from the first input signal source 12 is advanced by 90 degrees from the phase of the second signal output from the second input signal source 13. In addition, the electrical length of the second output circuit 27 is longer by 90 degrees than the electrical length of the first output circuit 24.

Therefore, the phase of the first signal output from the first output circuit 24 to the combining circuit 31 and the phase of the second signal output from the second output circuit 27 to the combining circuit 31 are in phase.

The combining circuit 31 combines in phase the first signal output from the first output circuit 24 and the second signal output from the second output circuit 27.

The combining circuit 31 outputs a combined signal of the first signal and the second signal to the output matching circuit 33.

The output matching circuit 33, when receiving the combined signal from the combining circuit 31, converts the impedance at the combining point 32 into the impedance of the external load 34 and outputs the combined signal to the load 34.

In the saturated output-time operation, the first signal output from the first output circuit 24 and the second signal output from the second output circuit 27 have the same amplitude at the combining point 32, and the first signal and the second signal are combined in phase by the combining circuit 31. At this time, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

At this time, since the characteristic impedance of the first output circuit 24 and the impedance seeing the combining point 32 from the first output circuit 24 coincide with each other, being Ropt, the first output circuit 24 does not modulate the impedance seeing the combining point 32 from the current source 18 of the first transistor 16 from Ropt.

In addition, since the characteristic impedance of the second output circuit 27 and the impedance seeing the combining point 32 from the second output circuit 27 coincide with each other, being Ropt, the second output circuit 27 does not modulate the impedance seeing the combining point 32 from the current source 22 of the second transistor 20 from Ropt.

The impedance seen from the current source 18 of the first transistor 16 and the impedance seen from the current source 22 of the second transistor 20 are both Ropt, and a saturated power is obtained from the Doherty amplifier 1.

[Back Off-Time Operation of Doherty Amplifier 1 in First Doherty Operation Mode]

Next, a back off-time operation of the Doherty amplifier 1 in the first Doherty operation mode will be described.

Figure 5:
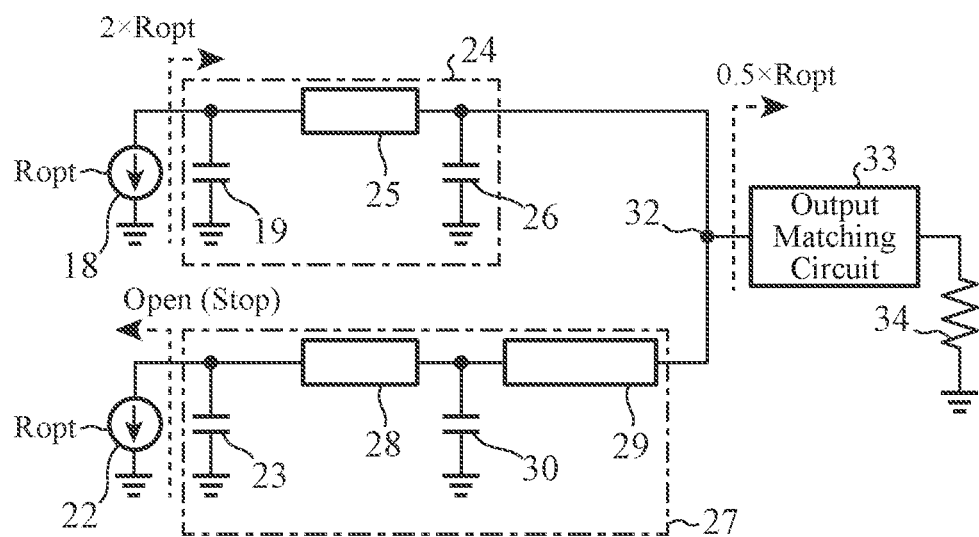
FIG. 5 is an explanatory diagram illustrating a back off-time operation of the Doherty amplifier 1 in a first Doherty operation mode.

FIG. 5 is an explanatory diagram illustrating the back off-time operation of the Doherty amplifier 1 in the first Doherty operation mode.

Figure 6:
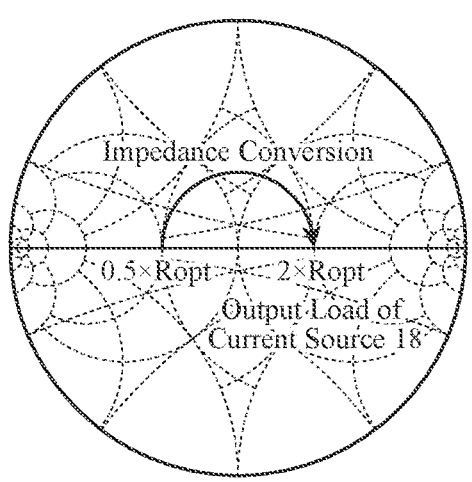
FIG. 6 is an explanatory diagram illustrating load transformation in the back off-time operation of the Doherty amplifier 1 in the first Doherty operation mode.

FIG. 6 is an explanatory diagram illustrating load transformation in the back off-time operation of the Doherty amplifier 1 in the first Doherty operation mode.

In the back off-time operation, only the first transistor 16 performs the signal amplification operation, and the second transistor 20 stops the signal amplification operation.

The first input signal source 12 outputs, as a first signal, a signal in which the output power of the first transistor 16 is about half of the saturated power to the first input matching circuit 14.

Specifically, as illustrated in FIGS. 4A and 4B, the first input signal source 12 outputs, to the first input matching circuit 14, a first signal having an amplitude at which the voltage of the combined signal output from the combining circuit 31 is "0.5" and having a phase of about 90 degrees.

The amplitude of the first signal at which the voltage of the combined signal output from the combining circuit 31 is "0.5" is larger than zero and smaller than the maximum value of the amplitude.

The second input signal source 13 outputs, as a second signal, a signal in which the output power of the second transistor 20 is zero to the second input matching circuit 15.

Specifically, as illustrated in FIGS. 4A and 4B, the second input signal source 13 outputs, to the second input matching circuit 15, a second signal having an amplitude at which the voltage of the combined signal output from the combining circuit 31 is "0.5" and having a phase of about 0 degrees.

The amplitude of the second signal at which the voltage of the combined signal output from the combining circuit 31 is "0.5" is zero.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The second transistor 20, even when receiving the second signal from the second input matching circuit 15, stops without performing the signal amplification operation, since the amplitude of the second signal is zero.

Since the second transistor 20 stops, the current source 22 of the second transistor 20 is in an Open state as illustrated in FIG. 5.

In the back off-time operation, the impedance seeing the second transistor 20 from the combining point 32 is infinite because the electrical length of the second output circuit 27 is 180 degrees.

Since the impedance seeing the second transistor 20 from the combining point 32 is infinite, the impedance seeing the combining circuit 31 from the first output circuit 24 is 0.5×Ropt.

Since the characteristic impedance of the first output circuit 24 is Ropt and the impedance seeing the combining circuit 31 from the first output circuit 24 is 0.5×Ropt, as illustrated in FIG. 6, the first output circuit 24 modulates the impedance seeing the combining point 32 from the current source 18 of the first transistor 16 from Ropt to 2×Ropt.

Since the first output circuit 24 modulates the impedance seeing the combining point 32 from the current source 18 of the first transistor 16 from Ropt to 2×Ropt, when the output power of the first transistor 16 is lower than the saturated power, a high-resistance load is connected to the first transistor 16. That is, when the output power of the first transistor 16 is lower than the saturated power, the load resistance of the first transistor 16 is 2×Ropt larger than Ropt.

Since the first transistor 16 is in a state of being connected to a high-resistance load, the highly efficient amplification operation can be performed.

Next, the Doherty amplifier 1 operating in the first outphasing operation mode will be described.

As illustrated in FIG. 2, the first outphasing operation mode is an operation mode when each of the frequency of the first signal and the frequency of the second signal is the second frequency $f_2$ lower than the first frequency $f_1$.

FIG. 7 is an explanatory diagram illustrating the first signal and the second signal in the first outphasing operation mode.

FIG. 7A illustrates the amplitude of the first signal output from the first input signal source 12 and the amplitude of the second signal output from the second input signal source 13.

FIG. 7B illustrates a phase of the first signal output from the first input signal source 12 and a phase of the second signal output from the second input signal source 13.

FIG. 7C illustrates a phase difference between the phase of the first signal output from the first input signal source 12 and the phase of the second signal output from the second input signal source 13. The phase difference is a value obtained by subtracting the phase of the second signal output from the second input signal source 13 from the phase of the first signal output from the first input signal source 12.

The horizontal axis in each of FIGS. 7A, 7B, and 7C represents the current of the combined signal output from the combining circuit 31. The current is a normalized current.

In the first outphasing operation mode, as illustrated in FIG. 7A, each of the amplitude of the first signal output from the first input signal source 12 and the amplitude of the second signal output from the second input signal source 13 monotonically increases with an increase in the current of the combined signal output from the combining circuit 31.

The amplitude of the first signal output from the first input signal source 12 is the same value as the amplitude of the second signal output from the second input signal source 13.

The output power of the first transistor 16 is a saturated power when the amplitude of the first signal is maximum, and the output power of the second transistor 20 is a saturated power when the amplitude of the second signal is maximum.

The phase of the first signal output from the first input signal source 12 monotonically decreases with an increase in the current of the combined signal output from the combining circuit 31.

The phase of the second signal output from the second input signal source 13 monotonically increases with an increase in the current of the combined signal output from the combining circuit 31.

The phase of the first signal and the phase of the second signal are equal in an absolute value, and the phase of the first signal and the phase of the second signal are different from each other in a sign. The sign of the phase of the first signal is a plus sign, and the sign of the phase of the second signal is a minus sign.

Therefore, the phase difference between the phase of the first signal output from the first input signal source 12 and the phase of the second signal output from the second input signal source 13 decreases as the current of the combined signal output from the combining circuit 31 increases.

For example, when the current of the combined signal output from the combining circuit 31 is "0", the phase difference is 240 degrees, and when the current of the combined signal output from the combining circuit 31 is "1", the phase difference is 60 degrees.

The first outphasing operation mode includes the saturated output-time operation and the back off-time operation.

In the back off-time operation included in the first outphasing operation mode, the second transistor 20 is not stopped, and both the first transistor 16 and the second transistor 20 perform the signal amplification operation.

In the first outphasing operation mode, each of the frequency of the first signal and the frequency of the second signal is the second frequency $f_2$. When the second frequency $f_2$ is, for example, 0.67×$f_0$, the electrical length of the first output circuit 24 is about 60 degrees, and the electrical length of the second output circuit 27 is about 120 degrees.

Hereinafter, an example in which the second frequency $f_2$ is 0.67×$f_0$ will be described.

[Saturated Output-Time Operation of Doherty Amplifier 1 in First Outphasing Operation Mode]

The saturated output-time operation of the Doherty amplifier 1 in the first outphasing operation mode will be described.

The first input signal source 12 outputs, as a first signal, a signal in which the output power of the first transistor 16 is a saturated power to the first input matching circuit 14.

Specifically, as illustrated in FIGS. 7A and 7B, the first input signal source 12 outputs, to the first input matching circuit 14, a first signal having an amplitude at which the current of the combined signal output from the combining circuit 31 is "1" and having a phase of about 30 degrees.

The second input signal source 13 outputs, as a second signal, a signal in which the output power of the second transistor 20 is a saturated power to the second input matching circuit 15.

Specifically, as illustrated in FIGS. 7A and 7B, the second input signal source 13 outputs, to the second input matching circuit 15, a second signal having an amplitude at which the current of the combined signal output from the combining circuit 31 is "1" and having a phase of about −30 degrees.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the saturated output-time operation, both the first transistor 16 and the second transistor 20 perform a signal amplification operation, and the phase of the first signal output from the first input signal source 12 is advanced by 60 degrees from the phase of the second signal output from the second input signal source 13. In addition, the electrical length of the second output circuit 27 is longer by 60 degrees than the electrical length of the first output circuit 24.

Therefore, the phase of the first signal output from the first output circuit 24 to the combining circuit 31 and the phase of the second signal output from the second output circuit 27 to the combining circuit 31 are in phase.

The combining circuit 31 combines in phase the first signal output from the first output circuit 24 and the second signal output from the second output circuit 27.

The combining circuit 31 outputs a combined signal of the first signal and the second signal to the output matching circuit 33.

The output matching circuit 33, when receiving the combined signal from the combining circuit 31, converts the impedance at the combining point 32 into the impedance of the external load 34 and outputs the combined signal to the load 34.

In the saturated output-time operation, the first signal output from the first output circuit 24 and the second signal output from the second output circuit 27 have the same amplitude at the combining point 32, and the first signal and the second signal are combined in phase by the combining circuit 31. At this time, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

At this time, since the characteristic impedance of the first output circuit 24 and the impedance seeing the combining point 32 from the first output circuit 24 coincide with each other, being Ropt, the first output circuit 24 does not modulate the impedance seeing the combining point 32 from the current source 18 of the first transistor 16 from Ropt.

In addition, since the characteristic impedance of the second output circuit 27 and the impedance seeing the combining point 32 from the second output circuit 27 coincide with each other, being Ropt, the second output circuit 27 does not modulate the impedance seeing the combining point 32 from the current source 22 of the second transistor 20 from Ropt.

The impedance seen from the current source 18 of the first transistor 16 and the impedance seen from the current source 22 of the second transistor 20 are both Ropt, and a saturated power is obtained from the Doherty amplifier 1.

[Back Off-Time Operation of Doherty Amplifier 1 in First Outphasing Operation Mode]

The back off-time operation of the Doherty amplifier 1 in the first outphasing operation mode will be described.

Figure 8:
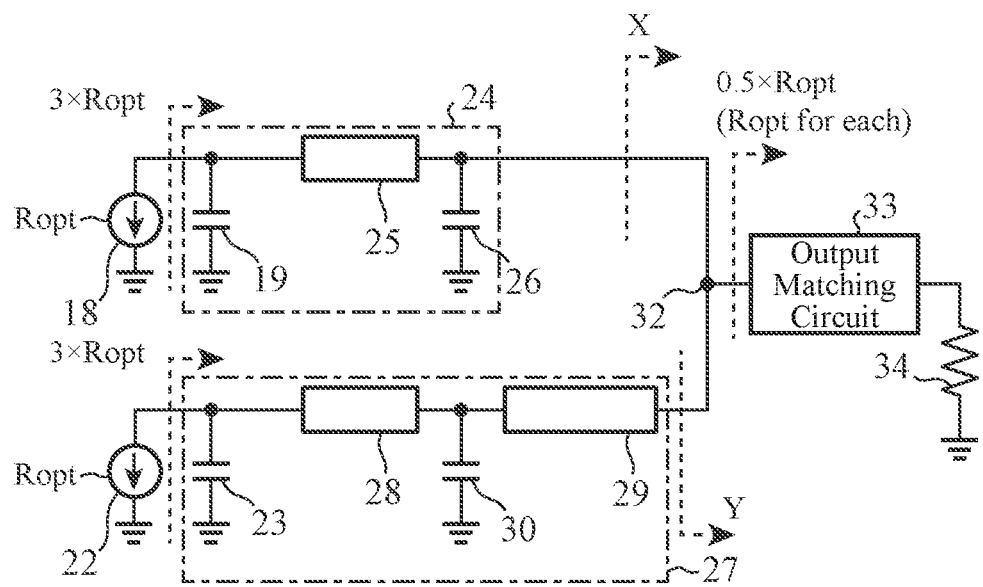
FIG. 8 is an explanatory diagram illustrating a back off-time operation of the Doherty amplifier 1 in a first outphasing operation mode.

FIG. 8 is an explanatory diagram illustrating the back off-time operation of the Doherty amplifier 1 in the first outphasing operation mode.

Figure 9:
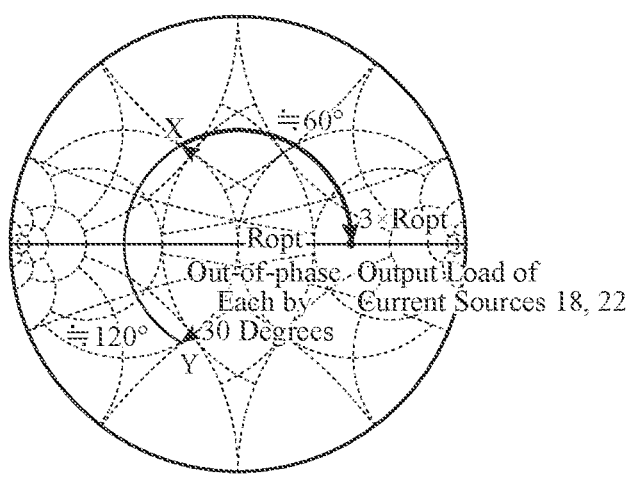
FIG. 9 is an explanatory diagram illustrating load transformation in the back off-time operation of the Doherty amplifier 1 in the first outphasing operation mode.

FIG. 9 is an explanatory diagram illustrating load transformation in the back off-time operation of the Doherty amplifier 1 in the first outphasing operation mode.

Here, as an operation of the back off-time operation, for example, an operation when the output power of each of the first transistor 16 and the second transistor 20 becomes about ⅓ of the saturated power will be described.

The first input signal source 12 outputs, as a first signal, a signal in which the output power of the first transistor 16 becomes about ⅓ of the saturated power to the first input matching circuit 14.

Specifically, the first input signal source 12 outputs, to the first input matching circuit 14, a first signal having a phase of about 60 degrees that is out of phase by +30 degrees from a phase of about 30 degrees when the output power of the first transistor 16 is a saturated power. The amplitude of the first signal at this time corresponds to the current of the combined signal corresponding to the first signal having a phase of about 60 degrees.

The second input signal source 13 outputs, as a second signal, a signal in which the output power of the second transistor 20 becomes about ⅓ of the saturated power to the second input matching circuit 15.

Specifically, the second input signal source 13 outputs, to the second input matching circuit 15, a second signal having a phase of about −60 degrees that is out of phase by −30 degrees from a phase of about −30 degrees when the output power of the second transistor 20 is a saturated power. The amplitude of the second signal at this time corresponds to the current of the combined signal corresponding to the second signal having the phase of about −60 degrees.

The phase difference between the phase of the first signal output from the first input signal source 12 and the phase of the second signal output from the second input signal source 13 is 120 degrees.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the back off-time operation included in the first outphasing operation mode, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

In addition, since the phase of the first signal output from the first output circuit 24 is a phase of about 60 degrees that is out of phase by +30 degrees from the phase in the saturated output-time operation, Ropt, which is the impedance seeing the combining point 32 from the first output circuit 24, is transformed into an inductive region. In FIG. 9, the impedance seeing the second transistor 20 from the combining point 32 is transformed to a point X.

The characteristic impedance of the first output circuit 24 is Ropt, and the electrical length of the first output circuit 24 is about 60 degrees.

Therefore, as illustrated in FIG. 9, the first output circuit 24 modulates the impedance seeing the combining point 32 from the current source 18 of the first transistor 16 from the point X to 3×Ropt with an electrical length of about 60 degrees.

In addition, since the phase of the second signal output from the second output circuit 27 is about −60 degrees, which is −30 degrees out of phase from the phase in the saturated output-time operation, Ropt, which is the impedance seeing the combining point 32 from the second output circuit 27, is transformed into a capacitive region. In FIG. 9, the impedance seeing the second transistor 20 from the combining point 32 is transformed to a point Y.

The characteristic impedance of the second output circuit 27 is Ropt, and the electrical length of the second output circuit 27 is about 120 degrees.

Therefore, as illustrated in FIG. 9, the second output circuit 27 modulates the impedance seeing the combining point 32 from the current source 22 of the second transistor 20 from the point Y to 3×Ropt with an electrical length of about 120 degrees.

Since the first output circuit 24 modulates the impedance seeing the combining point 32 from the current source 18 of the first transistor 16 to 3×Ropt, when the output power of the first transistor 16 is lower than the saturated power, a high-resistance load is connected to the first transistor 16. That is, when the output power of the first transistor 16 is lower than the saturated power, the load resistance of the first transistor 16 is 3×Ropt larger than Ropt.

Since the first transistor 16 is in a state of being connected to a high-resistance load, the highly efficient amplification operation can be performed.

Since the second output circuit 27 modulates the impedance seeing the combining point 32 from the current source 22 of the second transistor 20 to 3×Ropt, when the output power of the second transistor 20 is lower than the saturated power, a high-resistance load is connected to the second transistor 20. That is, when the output power of the second transistor 20 is lower than the saturated power, the load resistance of the second transistor 20 is 3×Ropt larger than Ropt.

Since the second transistor 20 is in a state of being connected to a high-resistance load, a highly efficient amplification operation can be performed.

In the first embodiment described above, the Doherty amplifier 1 is configured such that the signal mode in which the first signal amplified by the first transistor 16 and the second signal amplified by the second transistor 20 are combined in phase and the signal mode in which the first signal amplified by the first transistor 16 and the second signal amplified by the second transistor 20 are combined out of phase are switched in accordance with the frequency, and the operation mode is switched to the Doherty operation mode or the outphasing operation mode depending on the switched signal mode. Therefore, even when the frequency of the first signal amplified by the first transistor 16 and the frequency of the second signal amplified by the second transistor 20 change, the Doherty amplifier 1 can widen the bandwidth of the efficiency characteristic at the time of back off.

Second Embodiment

In a second embodiment, a Doherty amplifier 1 that operates in a second outphasing operation mode will be described.

A configuration of the Doherty amplifier 1 of the second embodiment is similar to the configuration of the Doherty amplifier 1 of the first embodiment, and a configuration diagram illustrating the Doherty amplifier 1 of the second embodiment is illustrated in FIG. 3.

As illustrated in FIG. 2, the second outphasing operation mode is an operation mode when each of the frequency of the first signal and the frequency of the second signal is a third frequency $f_3$ higher than the first frequency $f_1$.

FIG. 10 is an explanatory diagram illustrating the first signal and the second signal in the second outphasing operation mode.

Figure 10A:
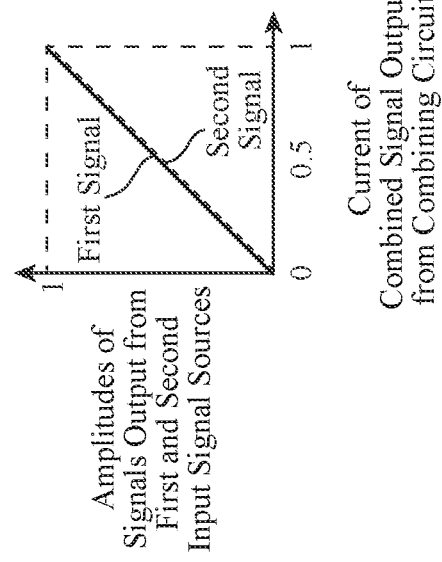
FIG. 10A is an explanatory diagram illustrating an amplitude of a first signal output from a first input signal source 12 and an amplitude of a second signal output from a second input signal source 13.

FIG. 10A illustrates an amplitude of the first signal output from the first input signal source 12 and an amplitude of the second signal output from the second input signal source 13.

Figure 10B:
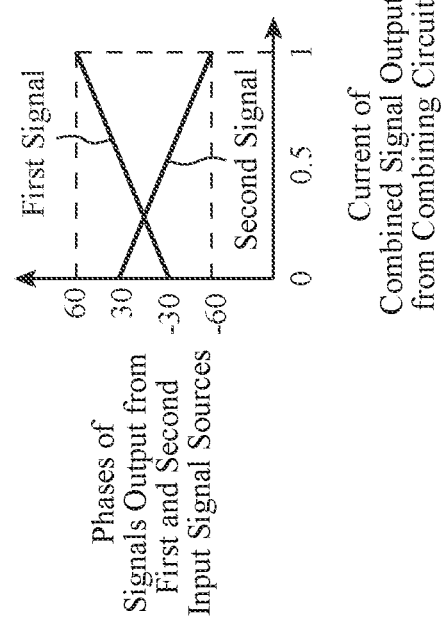
FIG. 10B is an explanatory diagram illustrating a phase of the first signal output from the first input signal source 12 and a phase of the second signal output from the second input signal source 13.

FIG. 10B illustrates a phase of the first signal output from the first input signal source 12 and a phase of the second signal output from the second input signal source 13.

Figure 10C:
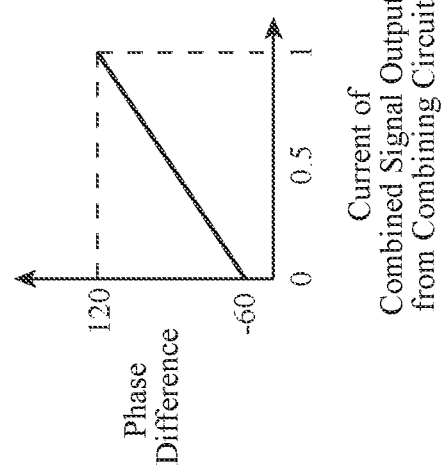
FIG. 10C is an explanatory diagram illustrating a phase difference between the phase of the first signal output from the first input signal source 12 and the phase of the second signal output from the second input signal source 13.

FIG. 10C illustrates a phase difference between the phase of the first signal output from the first input signal source 12 and the phase of the second signal output from the second input signal source 13. The phase difference is a value obtained by subtracting the phase of the second signal output from the second input signal source 13 from the phase of the first signal output from the first input signal source 12.

The horizontal axis in each of FIGS. 10A, 10B, and 10C represents a current of the combined signal output from the combining circuit 31. The current is a normalized current.

In the second outphasing operation mode, as illustrated in FIG. 10A, each of the amplitude of the first signal output from the first input signal source 12 and the amplitude of the second signal output from the second input signal source 13 monotonically increases with an increase in the current of the combined signal output from the combining circuit 31.

The amplitude of the first signal output from the first input signal source 12 is the same value as the amplitude of the second signal output from the second input signal source 13.

The output power of the first transistor 16 is a saturated power when the amplitude of the first signal is maximum, and the output power of the second transistor 20 is a saturated power when the amplitude of the second signal is maximum.

The phase of the first signal output from the first input signal source 12 monotonically decreases with an increase in the current of the combined signal output from the combining circuit 31.

The phase of the second signal output from the second input signal source 13 monotonically increases with an increase in the current of the combined signal output from the combining circuit 31.

The phase of the first signal and the phase of the second signal are equal in an absolute value, and the phase of the first signal and the phase of the second signal are different from each other in a sign.

For example, when the current of the combined signal output from the combining circuit 31 is "0", the phase difference is 60 degrees, and when the current of the combined signal output from the combining circuit 31 is "1", the phase difference is 120 degrees.

In the Doherty amplifier 1 of the second embodiment, it is assumed that the output resistance of each of the first transistor 16 and the second transistor 20 is Ropt, and the impedance seeing the load 34 from the combining point 32 is 0.5×Ropt.

The second outphasing operation mode includes a saturated output-time operation and a back off-time operation.

In the back off-time operation included in the second outphasing operation mode, the second transistor 20 is not stopped, and both the first transistor 16 and the second transistor 20 perform a signal amplification operation.

In the second outphasing operation mode, each of the frequency of the first signal and the frequency of the second signal is a third frequency $f_3$. When the third frequency $f_3$ is, for example, $1.33 \times f_0$, the electrical length of the first output circuit 24 is about 120 degrees, and the electrical length of the second output circuit 27 is about 240 degrees.

Hereinafter, an example in which the third frequency $f_3$ is $1.33 \times f_0$ will be described.

[Saturated Output-Time Operation of Doherty Amplifier 1 in Second Outphasing Operation Mode]

The saturated output-time operation of the Doherty amplifier 1 in the second outphasing operation mode will be described.

The first input signal source 12 outputs, as a first signal, a signal in which the output power of the first transistor 16 is a saturated power to the first input matching circuit 14.

Specifically, as illustrated in FIGS. 10A and 10B, the first input signal source 12 outputs a first signal having an amplitude at which the current of the signal output from the combining circuit 31 is "1" and having a phase of about 60 degrees to the first input matching circuit 14.

The second input signal source 13 outputs, as a second signal, a signal in which the output power of the second transistor 20 is a saturated power to the second input matching circuit 15.

Specifically, as illustrated in FIGS. 10A and 10B, the second input signal source 13 outputs a second signal having an amplitude at which the current of the signal output from the combining circuit 31 is "1" and having a phase of about −60 degrees to the second input matching circuit 15.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the saturated output-time operation, both the first transistor 16 and the second transistor 20 perform a signal amplification operation, and the phase of the first signal output from the first input signal source 12 is advanced by 120 degrees from the phase of the second signal output from the second input signal source 13. In addition, the electrical length of the second output circuit 27 is longer by 120 degrees than the electrical length of the first output circuit 24.

Therefore, the phase of the first signal output from the first output circuit 24 to the combining circuit 31 and the phase of the second signal output from the second output circuit 27 to the combining circuit 31 are in phase.

The combining circuit 31 combines in phase the first signal output from the first output circuit 24 and the second signal output from the second output circuit 27.

The combining circuit 31 outputs a combined signal of the first signal and the second signal to the output matching circuit 33.

The output matching circuit 33, when receiving the combined signal from the combining circuit 31, converts the impedance at the combining point 32 into the impedance of the external load 34 and outputs the combined signal to the load 34.

In the saturated output-time operation, the first signal output from the first output circuit 24 and the second signal output from the second output circuit 27 have the same amplitude at the combining point 32, and the first signal and the second signal are combined in phase by the combining circuit 31. At this time, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

At this time, since the characteristic impedance of the first output circuit 24 and the impedance seeing the combining point 32 from the first output circuit 24 coincide with each other, being Ropt, the first output circuit 24 does not modulate the impedance seeing the combining point 32 from the current source 18 of the first transistor 16 from Ropt.

In addition, since the characteristic impedance of the second output circuit 27 and the impedance seeing the combining point 32 from the second output circuit 27 coincide with each other, being Ropt, the second output circuit 27 does not modulate the impedance seeing the combining point 32 from the current source 22 of the second transistor 20 from Ropt.

The impedance seen from the current source 18 of the first transistor 16 and the impedance seen from the current source 22 of the second transistor 20 are both Ropt, and a saturated power is obtained from the Doherty amplifier 1.

[Back Off-Time Operation of Doherty Amplifier 1 in Second Outphasing Operation Mode]

The back off-time operation of the Doherty amplifier 1 in the second outphasing operation mode will be described.

Figure 11:
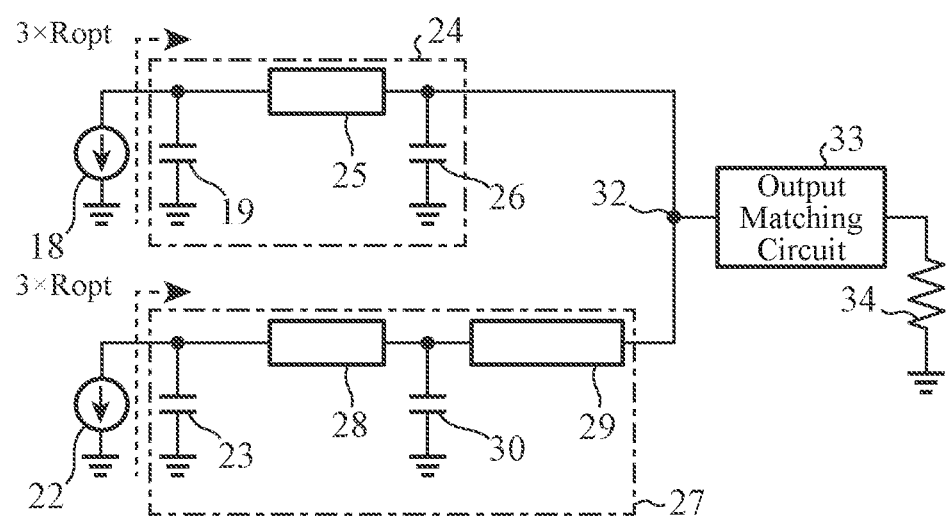
FIG. 11 is an explanatory diagram illustrating a back off-time operation of the Doherty amplifier 1 in a second outphasing operation mode.

FIG. 11 is an explanatory diagram illustrating the back off-time operation of the Doherty amplifier 1 in the second outphasing operation mode.

Here, as an operation of the back off-time operation, for example, an operation when the output power of each of the first transistor 16 and the second transistor 20 becomes about ⅓ of the saturated power will be described.

The first input signal source 12 outputs, as a first signal, a signal in which the output power of the first transistor 16 becomes about ⅓ of the saturated power to the first input matching circuit 14.

Specifically, the first input signal source 12 outputs, to the first input matching circuit 14, a first signal having a phase of about 30 degrees that is out of phase by −30 degrees from a phase of about 60 degrees when the output power of the first transistor 16 is a saturated power. The amplitude of the first signal at this time corresponds to the current of the combined signal corresponding to the first signal having a phase of about 30 degrees.

The second input signal source 13 outputs, as a second signal, a signal in which the output power of the second transistor 20 becomes about ⅓ of the saturated power to the second input matching circuit 15.

Specifically, the second input signal source 13 outputs, to the second input matching circuit 15, a second signal having a phase of about −30 degrees that is out of phase by +30 degrees from a phase of about −60 degrees when the output power of the second transistor 20 is a saturated power. The amplitude of the second signal at this time corresponds to the current of the combined signal corresponding to the second signal having the phase of about −30 degrees.

The phase difference between the phase of the first signal output from the first input signal source 12 and the phase of the second signal output from the second input signal source 13 is 120 degrees.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the first signal to the combining circuit 31.

In the back off-time operation included in the second outphasing operation mode, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

In addition, since the phase of the first signal output from the first output circuit 24 is about 30 degrees, which is −30 degrees out of phase from the phase in the saturated output-time operation, Ropt, which is the impedance seeing the combining point 32 from the first output circuit 24, is transformed into an inductive region.

The characteristic impedance of the first output circuit 24 is Ropt, and the electrical length of the first output circuit 24 is about 120 degrees.

Therefore, the first output circuit 24 modulates the impedance seeing the combining point 32 from the current source 18 of the first transistor 16 to 3×Ropt with an electrical length of about 120 degrees.

In addition, since the phase of the second signal output from the second output circuit 27 is a phase of about −30 degrees that is out of phase by +30 degrees from the phase in the saturated output-time operation, Ropt, which is the impedance seeing the combining point 32 from the second output circuit 27, is transformed into a capacitive region.

The characteristic impedance of the second output circuit 27 is Ropt, and the electrical length of the second output circuit 27 is about 240 degrees.

Therefore, the second output circuit 27 modulates the impedance seeing the combining point 32 from the current source 22 of the second transistor 20 to 3×Ropt with an electrical length of about 240 degrees.

Since the first output circuit 24 modulates the impedance seeing the combining point 32 from the current source 18 of the first transistor 16 to 3×Ropt, when the output power of the first transistor 16 is lower than the saturated power, a high-resistance load is connected to the first transistor 16. That is, when the output power of the first transistor 16 is lower than the saturated power, the load resistance of the first transistor 16 is 3×Ropt larger than Ropt.

Since the first transistor 16 is in a state of being connected to a high-resistance load, the highly efficient amplification operation can be performed.

Since the second output circuit 27 modulates the impedance seeing the combining point 32 from the current source 22 of the second transistor 20 to 3×Ropt, when the output power of the second transistor 20 is lower than the saturated power, a high-resistance load is connected to the second transistor 20. That is, when the output power of the second output circuit 27 is lower than the saturated power, the load resistance of the second output circuit 27 is 3×Ropt larger than Ropt.

Since the second transistor 20 is in a state of being connected to a high-resistance load, the highly efficient amplification operation can be performed.

As described above, also in the Doherty amplifier 1 operating in the second outphasing operation mode, the bandwidth of the efficiency characteristic at the time of back-off can be widened as in the Doherty amplifier 1 operating in the first Doherty operation mode.

Third Embodiment

In a third embodiment, a Doherty amplifier 1 that operates in a second Doherty operation mode will be described.

A configuration of the Doherty amplifier 1 of the third embodiment is similar to the configuration of the Doherty amplifier 1 of the first embodiment, and a configuration diagram illustrating the Doherty amplifier 1 of the third embodiment is illustrated in FIG. 3.

As illustrated in FIG. 2, the second Doherty operation mode is an operation mode when each of the frequency of the first signal and the frequency of the second signal is a fourth frequency $f_4$ lower than the second frequency $f_2$.

Figure 12:
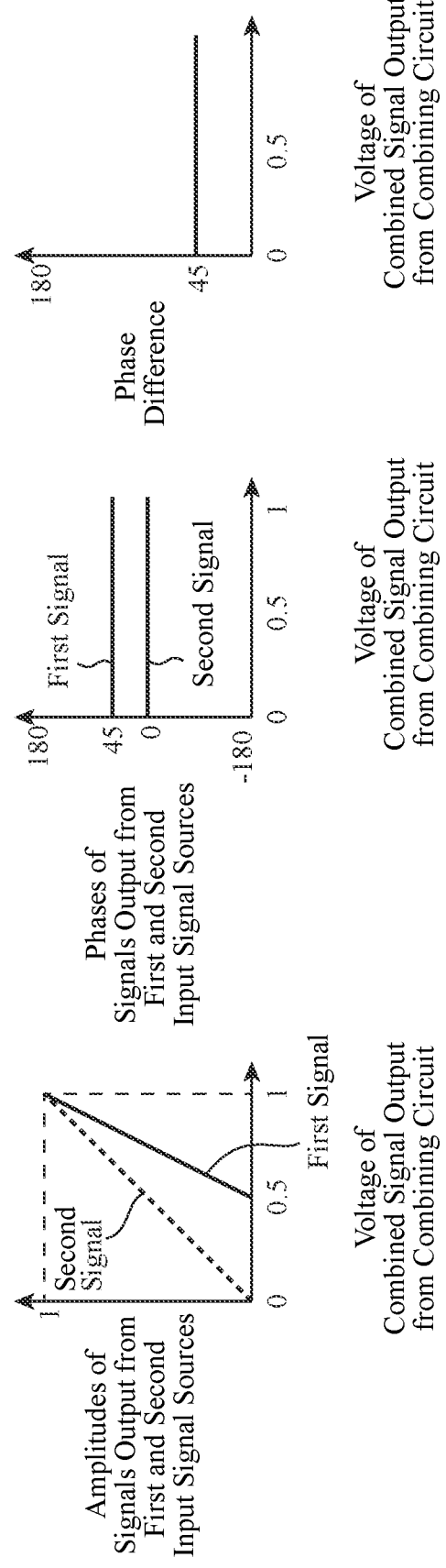
FIG. 12A is an explanatory diagram illustrating an amplitude of a first signal output from a first input signal source 12 and an amplitude of a second signal output from a second input signal source 13.
FIG. 12B is an explanatory diagram illustrating a phase of the first signal output from the first input signal source 12 and a phase of the second signal output from the second input signal source 13.
FIG. 12C is an explanatory diagram illustrating a phase difference between the phase of the first signal output from the first input signal source 12 and the phase of the second signal output from the second input signal source 13.

FIG. 12 is an explanatory diagram illustrating the first signal and the second signal in the second Doherty operation mode.

FIG. 12A illustrates an amplitude of the first signal output from the first input signal source 12 and an amplitude of the second signal output from the second input signal source 13.

FIG. 12B illustrates a phase of the first signal output from the first input signal source 12 and a phase of the second signal output from the second input signal source 13.

FIG. 12C illustrates a phase difference between the phase of the first signal output from the first input signal source 12 and the phase of the second signal output from the second input signal source 13. The phase difference is a value obtained by subtracting the phase of the second signal output from the second input signal source 13 from the phase of the first signal output from the first input signal source 12.

The horizontal axis in each of FIGS. 12A, 12B, and 12C represents the voltage of the combined signal output from the combining circuit 31. The voltage is a normalized voltage.

In the second Doherty operation mode, as illustrated in FIG. 12A, each of the amplitude of the first signal output from the first input signal source 12 and the amplitude of the second signal output from the second input signal source 13 monotonically increases with an increase in the voltage of the combined signal output from the combining circuit 31. The amplitude of the second signal when the amplitude of the first signal is zero is greater than zero.

The output power of the first transistor 16 is a saturated power when the amplitude of the first signal is maximum, and the output power of the second transistor 20 is a saturated power when the amplitude of the second signal is maximum.

As shown in FIG. 12B, the phase of the first signal output from the first input signal source 12 is about 45 degrees, the phase of the second signal output from the second input signal source 13 is about 0 degrees, and the phase of the first signal is advanced by about 45 degrees from the phase of the second signal.

In the Doherty amplifier 1 of the third embodiment, it is assumed that the output resistance of each of the first transistor 16 and the second transistor 20 is Ropt, and the impedance seeing the load 34 from the combining point 32 is 0.5×Ropt.

The second Doherty operation mode includes a saturated output-time operation and a back off-time operation.

In the back off-time operation included in the second Doherty operation mode, the first transistor 16 is stopped, and only the second transistor 20 performs the signal amplification operation.

Each of the frequency of the first signal and the frequency of the second signal is the fourth frequency $f_4$. When the fourth frequency $f_4$ is, for example, $0.5 \times f_0$, the electrical length of the first output circuit 24 is about 45 degrees, and the electrical length of the second output circuit 27 is about 90 degrees.

Hereinafter, an example in which the fourth frequency $f_4$ is $0.5 \times f_0$ will be described.

[Saturated Output-Time Operation of Doherty Amplifier 1 in Second Doherty Operation Mode]

The saturated output-time operation of the Doherty amplifier 1 in the second Doherty operation mode will be described.

The first input signal source 12 outputs, as a first signal, a signal in which the output power of the first transistor 16 is a saturated power to the first input matching circuit 14.

Specifically, as illustrated in FIGS. 12A and 12B, the first input signal source 12 outputs a first signal having an amplitude at which the voltage of the signal output from the combining circuit 31 is "1" and having a phase of about 45 degrees to the first input matching circuit 14.

The second input signal source 13 outputs, as a second signal, a signal in which the output power of the second transistor 20 is a saturated power to the second input matching circuit 15.

Specifically, as illustrated in FIGS. 12A and 12B, the second input signal source 13 outputs a second signal having an amplitude at which the voltage of the signal output from the combining circuit 31 is "1" and having a phase of about 0 degrees to the second input matching circuit 15.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the saturated output-time operation, both the first transistor 16 and the second transistor 20 perform the signal amplification operation, and the phase of the first signal output from the first input signal source 12 is advanced by 45 degrees from the phase of the second signal output from the second input signal source 13. In addition, the electrical length of the second output circuit 27 is longer by 45 degrees than the electrical length of the first output circuit 24.

Therefore, the phase of the first signal output from the first output circuit 24 to the combining circuit 31 and the phase of the second signal output from the second output circuit 27 to the combining circuit 31 are in phase.

The combining circuit 31 combines in phase the first signal output from the first output circuit 24 and the second signal output from the second output circuit 27.

The combining circuit 31 outputs a combined signal of the first signal and the second signal to the output matching circuit 33.

The output matching circuit 33, when receiving the combined signal from the combining circuit 31, converts the impedance at the combining point 32 into the impedance of the external load 34 and outputs the combined signal to the load 34.

In the saturated output-time operation, the first signal output from the first output circuit 24 and the second signal output from the second output circuit 27 have the same amplitude at the combining point 32, and the first signal and the second signal are combined in phase by the combining circuit 31. At this time, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

At this time, since the characteristic impedance of the first output circuit 24 and the impedance seeing the combining point 32 from the first output circuit 24 coincide with each other, being Ropt, the first output circuit 24 does not modulate the impedance seeing the combining point 32 is seen from the current source 18 of the first transistor 16 from Ropt.

In addition, since the characteristic impedance of the second output circuit 27 and the impedance seeing the combining point 32 from the second output circuit 27 coincide with each other, being Ropt, the second output circuit 27 does not modulate the impedance seeing the combining point 32 from the current source 22 of the second transistor 20 from Ropt.

The impedance seen from the current source 18 of the first transistor 16 and the impedance seen from the current source 22 of the second transistor 20 are both Ropt, and a saturated power is obtained from the Doherty amplifier 1.

[Back Off-Time Operation of Doherty Amplifier 1 in Second Doherty Operation Mode]

The back off-time operation of the Doherty amplifier 1 in the second Doherty operation mode will be described.

Figure 13:
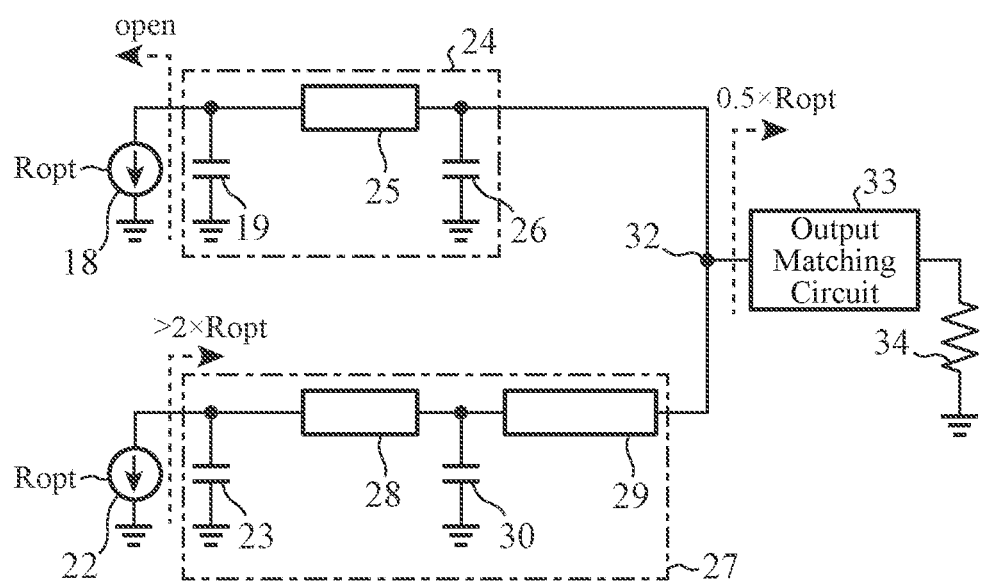
FIG. 13 is an explanatory diagram illustrating a back off-time operation of the Doherty amplifier 1 in a second Doherty operation mode.

FIG. 13 is an explanatory diagram illustrating a back off-time operation of the Doherty amplifier 1 in the second Doherty operation mode.

In the back off-time operation, only the second transistor 20 performs the signal amplification operation, and the first transistor 16 stops the signal amplification operation.

The first input signal source 12 outputs, as a first signal, a signal in which the output power of the first transistor 16 is zero to the first input matching circuit 14.

Specifically, as illustrated in FIGS. 12A and 12B, the first input signal source 12 outputs, to the first input matching circuit 14, a first signal having an amplitude at which the voltage of the signal output from the combining circuit 31 is "0.5" and having a phase of about 45 degrees.

The amplitude of the first signal at which the voltage of the combined signal output from the combining circuit 31 is "0.5" is zero.

The second input signal source 13 outputs, as a second signal, a signal in which the output power of the second transistor 20 is, for example, about half of the saturated power to the first input matching circuit 14.

Specifically, as illustrated in FIGS. 12A and 12B, the second input signal source 13 outputs a second signal having an amplitude at which the voltage of the signal output from the combining circuit 31 is "0.5" and having a phase of about 0 degrees to the second input matching circuit 15.

The amplitude of the second signal at which the voltage of the signal output from the combining circuit 31 is "0.5" is larger than zero and smaller than the maximum value of the amplitude.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The first transistor 16, even when receiving the first signal from the first input matching circuit 14, since the amplitude of the first signal is zero, stops without performing the signal amplification operation.

Since the first transistor 16 is stopped, the current source 18 of the first transistor 16 is in an Open state as illustrated in FIG. 13.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the back off-time operation, since the impedance seeing the first transistor 16 from the combining point 32 is infinite, the impedance seeing the combining circuit 31 from the second output circuit 27 is 0.5×Ropt.

Since the characteristic impedance of the second output circuit 27 is Ropt and the impedance seeing the combining circuit 31 from the second output circuit 27 is 0.5×Ropt, the second output circuit 27 modulates the impedance seeing the combining point 32 from the current source 22 of the second transistor 20 from Ropt to 2×Ropt.

Since the second output circuit 27 modulates the impedance seeing the combining point 32 from the current source 22 of the second transistor 20 from Ropt to 2×Ropt, when the output power of the second transistor 20 is lower than the saturated power, a high-resistance load is connected to the second transistor 20. That is, when the output power of the second output circuit 27 is lower than the saturated power, the load resistance of the second output circuit 27 is 2×Ropt larger than Ropt.

Since the second transistor 20 is in a state of being connected to a high-resistance load, a highly efficient amplification operation can be performed.

As described above, also in the Doherty amplifier 1 operating in the second Doherty operation mode, it is possible to widen the bandwidth of the efficiency characteristic at the time of back off, similarly to the Doherty amplifier 1 operating in the first Doherty operation mode.

Fourth Embodiment

In a fourth embodiment, a Doherty amplifier 1 that operates in a third Doherty operation mode will be described.

A configuration of the Doherty amplifier 1 of the fourth embodiment is similar to the configuration of the Doherty amplifier 1 of the first embodiment, and a configuration diagram illustrating the Doherty amplifier 1 of the fourth embodiment is illustrated in FIG. 3.

As illustrated in FIG. 2, the third Doherty operation mode is an operation mode when each of the frequency of the first signal and the frequency of the second signal is a fifth frequency $f_5$ higher than the third frequency $f_3$.

FIG. 14 is an explanatory diagram illustrating the first signal and the second signal in the third Doherty operation mode.

Figures 14A, 14B, 14C:
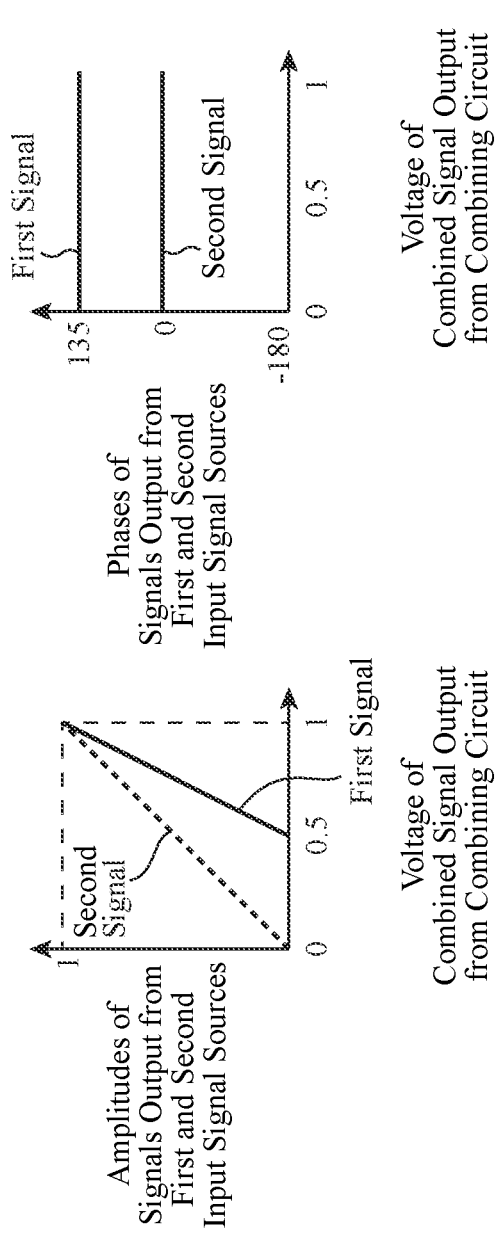
FIG. 14A is an explanatory diagram illustrating an amplitude of a first signal output from a first input signal source 12 and an amplitude of a second signal output from a second input signal source 13.
FIG. 14B is an explanatory diagram illustrating a phase of the first signal output from the first input signal source 12 and a phase of the second signal output from the second input signal source 13.
FIG. 14C is an explanatory diagram illustrating a phase difference between the phase of the first signal output from the first input signal source 12 and the phase of the second signal output from the second input signal source 13.

FIG. 14A illustrates an amplitude of the first signal output from the first input signal source 12 and an amplitude of the second signal output from the second input signal source 13.

FIG. 14B illustrates a phase of the first signal output from the first input signal source 12 and a phase of the second signal output from the second input signal source 13.

FIG. 14C illustrates a phase difference between the phase of the first signal output from the first input signal source 12 and the phase of the second signal output from the second input signal source 13. The phase difference is a value obtained by subtracting the phase of the second signal output from the second input signal source 13 from the phase of the first signal output from the first input signal source 12.

The horizontal axis in each of FIGS. 14A, 14B, and 14C represents the voltage of the combined signal output from the combining circuit 31. The voltage is a normalized voltage.

In the third Doherty operation mode, as illustrated in FIG. 14A, each of the amplitude of the first signal output from the first input signal source 12 and the amplitude of the second signal output from the second input signal source 13 monotonically increases with an increase in the voltage of the combined signal output from the combining circuit 31. The amplitude of the second signal when the amplitude of the first signal is zero is greater than zero.

The output power of the first transistor 16 is a saturated power when the amplitude of the first signal is maximum, and the output power of the second transistor 20 is a saturated power when the amplitude of the second signal is maximum.

As shown in FIG. 14B, the phase of the first signal output from the first input signal source 12 is about 135 degrees, the phase of the second signal output from the second input signal source 13 is about 0 degrees, and the phase of the first signal is advanced by about 135 degrees from the phase of the second signal.

In the Doherty amplifier 1 of the fourth embodiment, it is assumed that the output resistance of each of the first transistor 16 and the second transistor 20 is Ropt, and the impedance seeing the load 34 from the combining point 32 is 0.5×Ropt.

The third Doherty operation mode includes a saturated output-time operation and a back off-time operation.

In the back off-time operation included in the third Doherty operation mode, the first transistor 16 is stopped, and only the second transistor 20 performs the signal amplification operation.

Each of the frequency of the first signal and the frequency of the second signal is the fifth frequency $f_5$. When the fifth frequency $f_5$ is, for example, 1.5×$f_0$, the electrical length of the first output circuit 24 is about 135 degrees, and the electrical length of the second output circuit 27 is about 270 degrees.

Hereinafter, an example in which the fifth frequency $f_5$ is 1.5×$f_0$ will be described.

[Saturated Output-Time Operation of Doherty Amplifier 1 in Third Doherty Operation Mode]

The saturated output-time operation of the Doherty amplifier 1 in the third Doherty operation mode will be described.

The first input signal source 12 outputs, as a first signal, a signal in which the output power of the first transistor 16 is a saturated power to the first input matching circuit 14.

Specifically, as illustrated in FIGS. 14A and 14B, the first input signal source 12 outputs, to the first input matching circuit 14, a first signal having an amplitude at which the voltage of the combined signal output from the combining circuit 31 is "1" and having a phase of about 135 degrees.

The second input signal source 13 outputs, as a second signal, a signal in which the output power of the second transistor 20 is a saturated power to the second input matching circuit 15.

Specifically, as illustrated in FIGS. 14A and 14B, the second input signal source 13 outputs, to the second input matching circuit 15, a second signal having an amplitude at which the voltage of the combined signal output from the combining circuit 31 is "1" and having a phase of about 0 degrees.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The first transistor 16, when receiving the first signal from the first input matching circuit 14, amplifies the first signal and outputs the amplified first signal to the first output circuit 24.

The first output circuit 24 transmits the first signal output from the first transistor 16 and outputs the first signal to the combining circuit 31.

The second transistor 20, when receiving the second signal from the second input matching circuit 15, amplifies the second signal and outputs the amplified second signal to the second output circuit 27.

The second output circuit 27 transmits the second signal output from the second transistor 20 and outputs the second signal to the combining circuit 31.

In the saturated output-time operation, both the first transistor 16 and the second transistor 20 perform the signal amplification operation, and the phase of the first signal output from the first input signal source 12 is advanced by 135 degrees from the phase of the second signal output from the second input signal source 13. In addition, the electrical length of the second output circuit 27 is longer by 135 degrees than the electrical length of the first output circuit 24.

Therefore, the phase of the first signal output from the first output circuit 24 to the combining circuit 31 and the phase of the second signal output from the second output circuit 27 to the combining circuit 31 are in phase.

The combining circuit 31 combines in phase the first signal output from the first output circuit 24 and the second signal output from the second output circuit 27.

The combining circuit 31 outputs a combined signal of the first signal and the second signal to the output matching circuit 33.

The output matching circuit 33, when receiving the combined signal from the combining circuit 31, converts the impedance at the combining point 32 into the impedance of the external load 34 and outputs the combined signal to the load 34.

In the saturated output-time operation, the first signal output from the first output circuit 24 and the second signal output from the second output circuit 27 have the same amplitude at the combining point 32, and the first signal and the second signal are combined in phase by the combining circuit 31. At this time, the output load of the first transistor 16 and the output load of the second transistor 20 share the impedance at the combining point 32.

Therefore, the impedance seeing the combining point 32 from the first output circuit 24 and the impedance seeing the combining point 32 from the second output circuit 27 are both Ropt.

At this time, since the characteristic impedance of the first output circuit 24 and the impedance seeing the combining point 32 from the first output circuit 24 coincide with each other, being Ropt, the first output circuit 24 does not modulate the impedance seeing the combining point 32 from the current source 18 of the first transistor 16 from Ropt.

In addition, since the characteristic impedance of the second output circuit 27 and the impedance seeing the combining point 32 from the second output circuit 27 coincide with each other, being Ropt, the second output circuit 27 does not modulate the impedance seeing the combining point 32 from the current source 22 of the second transistor 20 from Ropt.

The impedance seen from the current source 18 of the first transistor 16 and the impedance seen from the current source 22 of the second transistor 20 are both Ropt, and a saturated power is obtained from the Doherty amplifier 1.

[Back Off-Time Operation of Doherty Amplifier 1 in Third Doherty Operation Mode]

The back off-time operation of the Doherty amplifier 1 in the third Doherty operation mode will be described.

Figure 15:
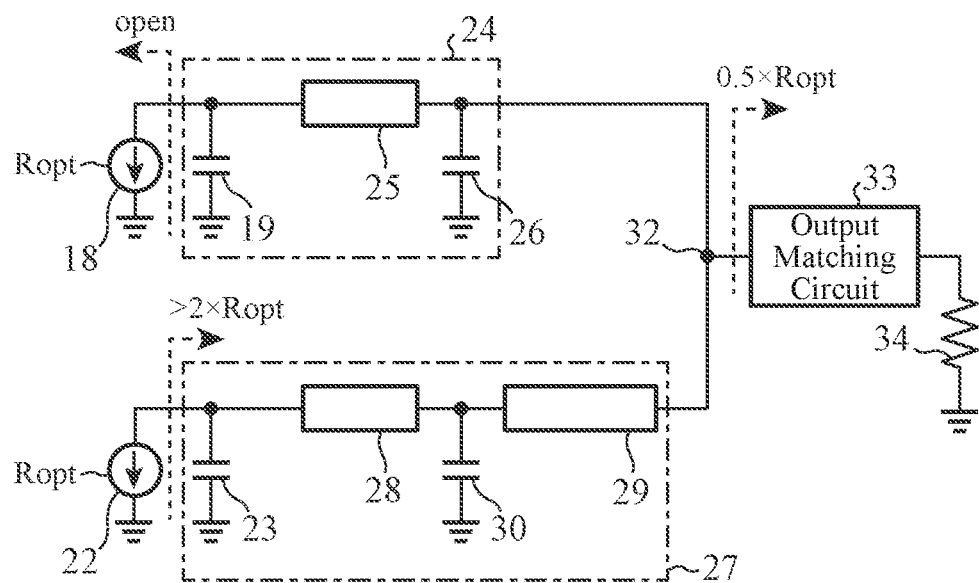
FIG. 15 is an explanatory diagram illustrating a back off-time operation of the Doherty amplifier 1 in a third Doherty operation mode.

FIG. 15 is an explanatory diagram illustrating the back off-time operation of the Doherty amplifier 1 in the third Doherty operation mode.

In the back off-time operation, only the second transistor 20 performs the signal amplification operation, and the first transistor 16 stops the signal amplification operation.

The first input signal source 12 outputs, as a first signal, a signal in which the output power of the first transistor 16 is zero to the first input matching circuit 14.

Specifically, as illustrated in FIGS. 14A and 14B, the first input signal source 12 outputs, to the first input matching circuit 14, a first signal having an amplitude at which the voltage of the signal output from the combining circuit 31 is "0.5" and having a phase of about 135 degrees.

The amplitude of the first signal at which the voltage of the combined signal output from the combining circuit 31 is "0.5" is zero.

The second input signal source 13 outputs, as a second signal, a signal in which the output power of the second transistor 20 is, for example, about half of the saturated power to the first input matching circuit 14.

Specifically, as illustrated in FIGS. 14A and 14B, the second input signal source 13 outputs, to the second input matching circuit 15, a second signal having an amplitude at which the voltage of the combined signal output from the combining circuit 31 is "0.5" and having a phase of about 0 degrees.

The amplitude of the second signal at which the voltage of the combined signal output from the combining circuit 31 is "0.5" is larger than zero and smaller than the maximum value of the amplitude.

The first input matching circuit 14, when receiving the first signal from the first input signal source 12, converts the impedance of the first input signal source 12 into the input impedance of the first transistor 16, and outputs the first signal to the input terminal 16a of the first transistor 16.

The first transistor 16, even when receiving the first signal from the first input matching circuit 14, since the amplitude of the first signal is zero, stops without performing the signal amplification operation.

Since the first transistor 16 is stopped, the current source 18 of the first transistor 16 is in an Open state as illustrated in FIG. 15.

The second input matching circuit 15, when receiving the second signal from the second input signal source 13, converts the impedance of the second input signal source 13 into the input impedance of the second transistor 20, and outputs the second signal to the input terminal 20a of the second transistor 20.

The second transistor 20, when receiving the second signal from the second input matching circuit 15, amplifies the second signal and outputs the amplified second signal to the second output circuit 27.

The second output circuit 27 transmits the second signal output from the second transistor 20 to the combining circuit 31.

In the back off-time operation, since the impedance seeing the first transistor 16 from the combining point 32 is infinite, the impedance seeing the combining circuit 31 from the second output circuit 27 is 0.5×Ropt.

Since the characteristic impedance of the second output circuit 27 is Ropt and the impedance seeing the combining circuit 31 from the second output circuit 27 is 0.5×Ropt, the second output circuit 27 modulates the impedance seeing the combining point 32 from the current source 22 of the second transistor 20 from Ropt to 2×Ropt.

Since the second output circuit 27 modulates the impedance seeing the combining circuit 32 from the current source 22 of the second transistor 20 from Ropt to 2×Ropt, when the output power of the second transistor 20 is lower than the saturated power, a high-resistance load is connected to the second transistor 20. That is, when the output power of the second output circuit 27 is lower than the saturated power, the load resistance of the second output circuit 27 is 2×Ropt larger than Ropt.

Since the second transistor 20 is in a state of being connected to a high-resistance load, a highly efficient amplification operation can be performed.

As described above, also in the Doherty amplifier 1 operating in the third Doherty operation mode, it is possible to widen the bandwidth of the efficiency characteristic at the time of back off, similarly to the Doherty amplifier 1 operating in the first Doherty operation mode.

Fifth Embodiment

In the Doherty amplifier 1 illustrated in FIG. 3, the first output circuit 24 includes the capacitor 19, the first transmission line 25, and the first capacitor 26.

In addition, in the Doherty amplifier 1 illustrated in FIG. 3, the second output circuit 27 includes the capacitor 23, the second transmission line 28, the third transmission line 29, and the second capacitor 30.

In a fifth embodiment, a Doherty amplifier 1 in which a first output circuit 24 includes the capacitor 19, an inductor 41, and a first transmission line 42, and a second output circuit 27 includes the capacitor 23, an inductor 43, a second transmission line 44, and a third transmission line 45 will be described.

A configuration of the Doherty amplifier 1 of the fifth embodiment is similar to the configuration of the Doherty amplifier 1 of the first embodiment, and a configuration diagram illustrating the Doherty amplifier 1 of the fifth embodiment is illustrated in FIG. 3.

Figure 16:
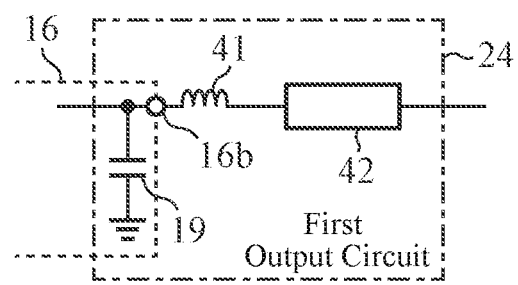
FIG. 16 is a configuration diagram illustrating a first output circuit 24 of a Doherty amplifier 1 according to a fifth embodiment.

FIG. 16 is a configuration diagram illustrating the first output circuit 24 of the Doherty amplifier 1 according to the fifth embodiment. In FIG. 16, the same reference numerals as those in FIG. 3 denote the same or corresponding parts, and thus description thereof is omitted.

Similarly to the first output circuit 24 illustrated in FIG. 3, the first output circuit 24 illustrated in FIG. 16 transmits the first signal output from the first transistor 16 to the combining circuit 31.

The first output circuit 24 illustrated in FIG. 16 modulates the impedance seeing the combining circuit 31 from the first transistor 16 in accordance with the frequency of the first signal amplified by the first transistor 16.

The electrical length of the first output circuit 24 illustrated in FIG. 16 changes in accordance with the frequency of the first signal, similarly to the first output circuit 24 illustrated in FIG. 3. For example, when the frequency of the first signal is the center frequency $f_0$ of the frequency range including the first frequency $f_1$, the electrical length of the first output circuit 24 is 90 degrees. However, the electrical length of the first output circuit 24 is not limited to the one exactly matching the electrical length of 90 degrees, and may be deviated from the electrical length of 90 degrees as long as there is no practical problem.

The inductor 41 is implemented by, for example, a wire.

One end of the inductor 41 is connected to the output terminal 16b of the first transistor 16, and the other end of the inductor 41 is connected to one end of the first transmission line 42.

One end of the first transmission line 42 is connected to the other end of the inductor 41, and the other end of the first transmission line 42 is connected to the input terminal 31a of the combining circuit 31.

The first transmission line 42 is, for example, a line having an electrical length of less than 90 degrees when the frequency of the first signal is the first frequency $f_1$.

Figure 17:
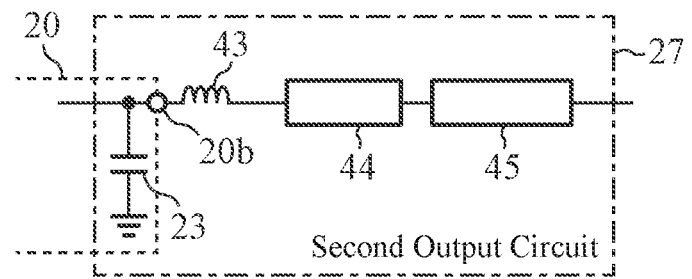
FIG. 17 is a configuration diagram illustrating a second output circuit 27 of the Doherty amplifier 1 according to the fifth embodiment.

FIG. 17 is a configuration diagram illustrating the second output circuit 27 of the Doherty amplifier 1 according to the fifth embodiment. In FIG. 17, the same reference numerals as those in FIG. 3 denote the same or corresponding parts, and thus description thereof is omitted.

Similarly to the second output circuit 27 illustrated in FIG. 3, the second output circuit 27 illustrated in FIG. 17 transmits the second signal output from the second transistor 20 to the combining circuit 31.

The second output circuit 27 illustrated in FIG. 17 modulates the impedance seeing the combining circuit 31 from the second transistor 20 in accordance with the frequency of the second signal amplified by the second transistor 20.

The electrical length of the second output circuit 27 illustrated in FIG. 17 changes in accordance with the frequency of the second signal, similarly to the second output circuit 27 illustrated in FIG. 3. For example, when the frequency of the second signal is the center frequency $f_0$, the electrical length of the second output circuit 27 is 180 degrees. However, the electrical length of the second output circuit 27 is not limited to the one exactly matching the electrical length of 180 degrees, and may be deviated from the electrical length of 180 degrees as long as there is no practical problem.

The inductor 43 is implemented by, for example, a wire.

One end of the inductor 43 is connected to the output terminal 20b of the second transistor 20, and the other end of the inductor 43 is connected to one end of the second transmission line 44.

One end of the second transmission line 44 is connected to the other end of the inductor 43, and the other end of the second transmission line 44 is connected to one end of the third transmission line 45.

The second transmission line 44 is, for example, a line having an electrical length of less than 90 degrees when the frequency of the second signal is the first frequency $f_1$.

One end of the third transmission line 45 is connected to the other end of the second transmission line 44, and the other end of the third transmission line 45 is connected to the input terminal 31b of the combining circuit 31.

The third transmission line 45 is, for example, a line having an electrical length of 90 degrees when the frequency of the second signal is the first frequency $f_1$. However, the electrical length of the third transmission line 45 is not limited to the one exactly matching the electrical length of 90 degrees, and may be deviated from the electrical length of 90 degrees as long as there is no practical problem.

Even in a case where the first output circuit 24 includes the capacitor 19, the inductor 41, and the first transmission line 42, similarly to the first output circuit 24 illustrated in FIG. 3, it is possible to modulate the impedance seeing the combining circuit 31 from the first transistor 16 in accordance with the frequency of the first signal.

Even in a case where the second output circuit 27 includes the capacitor 23, the inductor 43, the second transmission line 44, and the third transmission line 45, similarly to the second output circuit 27 illustrated in FIG. 3, it is possible to modulate the impedance seeing the combining circuit 31 from the second transistor 20 in accordance with the frequency of the second signal.

Therefore, similarly to the Doherty amplifier 1 according to the first to fourth embodiments, the Doherty amplifier 1 according to the fifth embodiment can also widen the bandwidth of the efficiency characteristic at the time of back off.

Sixth Embodiment

In the Doherty amplifier 1 illustrated in FIG. 3, the first output circuit 24 includes the capacitor 19, the first transmission line 25, and the first capacitor 26.

In addition, in the Doherty amplifier 1 illustrated in FIG. 3, the second output circuit 27 includes the capacitor 23, the second transmission line 28, the third transmission line 29, and the second capacitor 30.

In a sixth embodiment, a Doherty amplifier 1 will be described in which a first output circuit 24 includes the capacitor 19, a transmission line 51, a transmission line 52, a capacitor 53, and a capacitor 54, and a second output circuit 27 includes the capacitor 23, a transmission line 61, a transmission line 62, a transmission line 63, a capacitor 64, and a capacitor 65.

A configuration of the Doherty amplifier 1 of the sixth embodiment is similar to the configuration of the Doherty amplifier 1 of the first embodiment, and a configuration diagram illustrating the Doherty amplifier 1 of the sixth embodiment is illustrated in FIG. 3.

Figure 18:
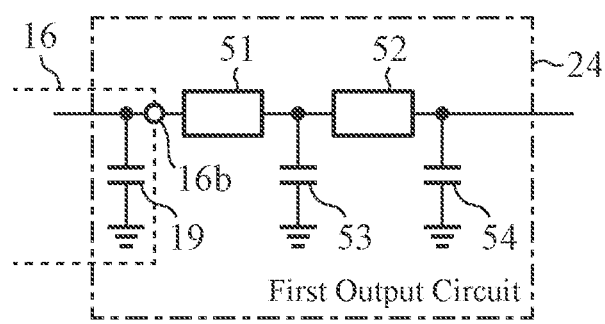
FIG. 18 is a configuration diagram illustrating a first output circuit 24 of a Doherty amplifier 1 according to a sixth embodiment.

FIG. 18 is a configuration diagram illustrating the first output circuit 24 of the Doherty amplifier 1 according to the sixth embodiment. In FIG. 18, the same reference numerals as those in FIG. 3 denote the same or corresponding parts, and thus description thereof is omitted.

Similarly to the first output circuit 24 illustrated in FIG. 3, the first output circuit 24 illustrated in FIG. 18 transmits the first signal output from the first transistor 16, and outputs the first signal to combining circuit 31.

The first output circuit 24 illustrated in FIG. 18 modulates the impedance seeing the combining circuit 31 from the first transistor 16 in accordance with the frequency of the first signal amplified by the first transistor 16.

The electrical length of the first output circuit 24 illustrated in FIG. 18 changes in accordance with the frequency of the first signal, similarly to the first output circuit 24 illustrated in FIG. 3. For example, when the frequency of the first signal is the center frequency $f_0$ of the frequency range including the first frequency $f_1$, the electrical length of the first output circuit 24 is 90 degrees. However, the electrical length of the first output circuit 24 is not limited to the one exactly matching the electrical length of 90 degrees, and may be deviated from the electrical length of 90 degrees as long as there is no practical problem.

One end of the transmission line 51 is connected to the output terminal 16b of the first transistor 16, and the other end of the transmission line 51 is connected to each of one end of the transmission line 52 and one end of the capacitor 53.

One end of the transmission line 52 is connected to each of the other end of the transmission line 51 and one end of the capacitor 53, and the other end of the transmission line 52 is connected to each of the input terminal 31a of the combining circuit 31 and one end of the capacitor 54.

The sum of the electrical length of the transmission line 51 and the electrical length of the transmission line 52 is, for example, an electrical length of less than 90 degrees when the frequency of the first signal is the first frequency $f_1$.

The capacitor 53 is connected to the transmission line 51 and the shunt. That is, one end of the capacitor 53 is connected to each of the other end of the transmission line 51 and one end of the transmission line 52, and the other end of the capacitor 53 is connected to the ground.

The capacitor 54 is connected to the transmission line 52 and the shunt. That is, one end of the capacitor 54 is connected to each of the other end of the transmission line 52 and the input terminal 31a of the combining circuit 31, and the other end of the capacitor 54 is connected to the ground.

Figure 19:
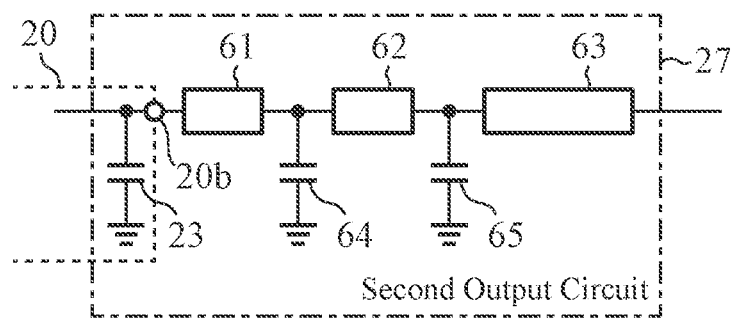
FIG. 19 is a configuration diagram illustrating a second output circuit 27 of the Doherty amplifier 1 according to the sixth embodiment.

FIG. 19 is a configuration diagram illustrating the second output circuit 27 of the Doherty amplifier 1 according to the sixth embodiment. In FIG. 19, the same reference numerals as those in FIG. 3 denote the same or corresponding parts, and thus description thereof is omitted.

Similarly to the second output circuit 27 illustrated in FIG. 3, the second output circuit 27 illustrated in FIG. 19 transmits the second signal output from the second transistor 20 and outputs the second signal to the combining circuit 31.

The second output circuit 27 illustrated in FIG. 19 modulates the impedance seeing the combining circuit 31 from the second transistor 20 in accordance with the frequency of the second signal amplified by the second transistor 20.

The electrical length of the second output circuit 27 illustrated in FIG. 19 changes in accordance with the frequency of the second signal, similarly to the second output circuit 27 illustrated in FIG. 3. For example, when the frequency of the second signal is the center frequency $f_0$, the electrical length of the second output circuit 27 is 180 degrees. However, the electrical length of the first output circuit 24 is not limited to the one exactly matching the electrical length of 180 degrees, and may be deviated from the electrical length of 180 degrees as long as there is no practical problem.

One end of the transmission line 61 is connected to the output terminal 20b of the second transistor 20, and the other end of the transmission line 61 is connected to each of one end of the transmission line 62 and one end of the capacitor 64.

One end of the transmission line 62 is connected to the other end of the transmission line 61 and one end of the capacitor 64, and the other end of the transmission line 62 is connected to each one end of the transmission line 63 and one end of the capacitor 65.

One end of the transmission line 63 is connected to each of the other end of the transmission line 62 and one end of the capacitor 65, and the other end of the transmission line 63 is connected to the input terminal 31b of the combining circuit 31.

The sum of the electrical length of the transmission line 61, the electrical length of the transmission line 62, and the electrical length of the transmission line 63 is, for example, an electrical length of less than 180 degrees when the frequency of the first signal is the first frequency $f_1$.

The capacitor 64 is connected to the transmission line 61 and the shunt. That is, one end of the capacitor 64 is connected to each of the other end of the transmission line 61 and one end of the transmission line 62, and the other end of the capacitor 64 is connected to the ground.

The capacitor 65 is connected to the transmission line 62 and the shunt. That is, one end of the capacitor 65 is connected to each of the other end of the transmission line 62 and one end of the transmission line 63, and the other end of the capacitor 65 is connected to the ground.

Even in a case where the first output circuit 24 includes the capacitor 19, the transmission line 51, the transmission line 52, the capacitor 53, and the capacitor 54, similarly to the first output circuit 24 illustrated in FIG. 3, it is possible to modulate the impedance seeing the combining circuit 31 from the first transistor 16 in accordance with the frequency of the first signal.

Even in a case where the second output circuit 27 includes the capacitor 23, the transmission line 61, the transmission line 62, the transmission line 63, the capacitor 64, and the capacitor 65, similarly to the second output circuit 27 illustrated in FIG. 3, it is possible to modulate the impedance seeing the combining circuit 31 from the second transistor 20 in accordance with the frequency of the second signal.

Therefore, similarly to the Doherty amplifier 1 according to the first to fourth embodiments, the Doherty amplifier 1 according to the sixth embodiment can also widen the bandwidth of the efficiency characteristic at the time of back off.

Seventh Embodiment

In the Doherty amplifier 1 illustrated in FIG. 3, a bias voltage substantially the same as the threshold voltage is applied to each of the input terminal 16a of the first transistor 16 and the input terminal 20a of the second transistor 20.

A bias voltage (Hereinafter, referred to as a "first bias voltage $V_{b1}$") higher than the threshold voltage $V_{thr}$ and lower than the first threshold voltage $V_1$ may be applied to the input terminal 16a of the first transistor 16. $V_{thr} < V_{b1} < V_1$.

In addition, a first bias voltage $V_{b1}$ higher than the threshold voltage $V_{thr}$ and lower than the first threshold voltage $V_1$ may be applied to the input terminal 20a of the second transistor 20.

As the first threshold voltage $V_1$, for example, a voltage about 1.1 times the threshold voltage $V_{thr}$ is considered.

A configuration of a Doherty amplifier 1 of the seventh embodiment is similar to the configuration of the Doherty amplifier 1 of the first embodiment, and a configuration diagram illustrating the Doherty amplifier 1 of the seventh embodiment is illustrated in FIG. 3.

When the first bias voltage $V_{b1}$ is applied to the input terminal 16a of the first transistor 16, the gain of the first transistor 16 is higher than when the same bias voltage as the threshold voltage $V_{thr}$ is applied.

In addition, when the first bias voltage $V_{b1}$ is applied to the input terminal 20a of the second transistor 20, the gain of the second transistor 20 is higher than when the same bias voltage as the threshold voltage $V_{thr}$ is applied.

A bias voltage (hereinafter, referred to as a "second bias voltage $V_{b2}$") lower than the threshold voltage $V_{thr}$ and higher than the second threshold voltage $V_2$ may be applied to the input terminal 16a of the first transistor 16. $V_2 < V_{b2} < V_{thr}$.

In addition, a second bias voltage $V_{b2}$ lower than the threshold voltage $V_{thr}$ and higher than the second threshold voltage $V_2$ may be applied to the input terminal 20a of the second transistor 20.

As the second threshold voltage $V_2$, for example, a voltage about 0.9 times the threshold voltage $V_{thr}$ is considered.

When the second bias voltage $V_{b2}$ is applied to the input terminal 16a of the first transistor 16, the efficiency of the first transistor 16 is higher than when the same bias voltage as the threshold voltage $V_{thr}$ is applied.

In addition, when the second bias voltage $V_{b2}$ is applied to the input terminal 20a of the second transistor 20, the efficiency of the second transistor 20 is higher than when the same bias voltage as the threshold voltage $V_{thr}$ is applied.

For example, in the first Doherty operation mode, when the first bias voltage $V_{b1}$ is applied to the input terminal 16a of the first transistor 16 and the second bias voltage $V_{b2}$ is applied to the input terminal 20a of the second transistor 20, both the gain and the efficiency of the Doherty amplifier 1 can be increased.

For example, in the second Doherty operation mode or the third Doherty operation mode, when the second bias voltage $V_{b2}$ is applied to the input terminal 16a of the first transistor 16 and the first bias voltage $V_{b1}$ is applied to the input terminal 20a of the second transistor 20, both the gain and the efficiency of the Doherty amplifier 1 can be increased.

Eighth Embodiment

In an eighth embodiment, a Doherty amplifier 1 including a control circuit 71 that controls a bias voltage applied to each of the input terminal 16a of the first transistor 16 and the input terminal 20a of the second transistor 20 will be described.

Figure 20:
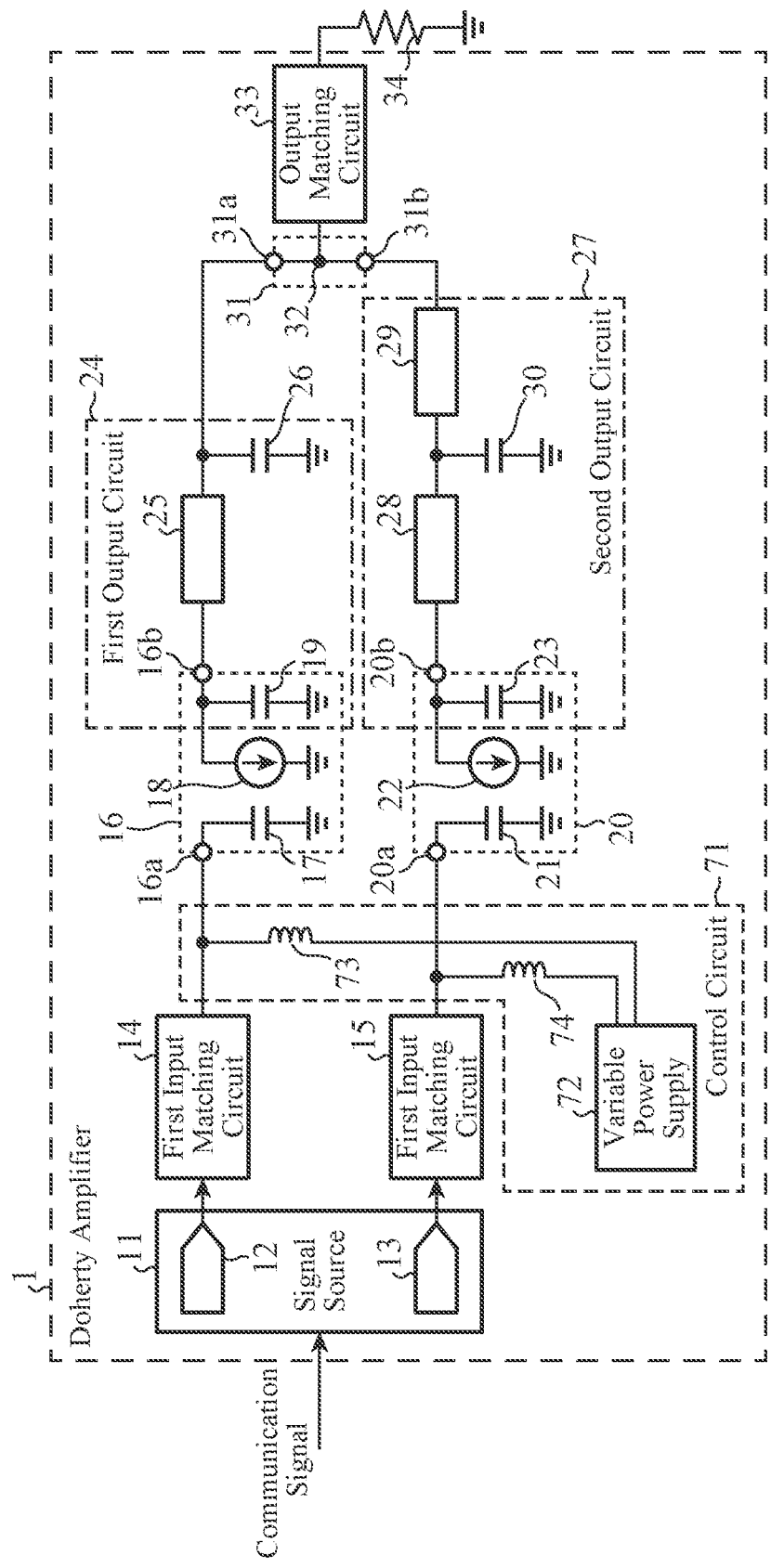
FIG. 20 is a configuration diagram illustrating a Doherty amplifier 1 according to an eighth embodiment.

FIG. 20 is a configuration diagram illustrating a Doherty amplifier 1 according to the eighth embodiment. In FIG. 20, the same reference numerals as those in FIG. 3 denote the same or corresponding parts, and thus description thereof is omitted.

The control circuit 71 includes a variable power supply 72, a gate bias circuit 73, and a gate bias circuit 74.

The control circuit 71 controls a bias voltage applied to each of the input terminal 16a of the first transistor 16 and the input terminal 20a of the second transistor 20.

The variable power supply 72 is a power supply capable of varying each of the voltage output to the gate bias circuit 73 and the voltage output to the gate bias circuit 74.

The gate bias circuit 73 is implemented by, for example, an inductor.

One end of the gate bias circuit 73 is connected to the variable power supply 72, and the other end of the gate bias circuit 73 is connected to each of the input terminal 16a of the first transistor 16 and the other end of the first input matching circuit 14b.

The gate bias circuit 73 increases the bias voltage applied to the input terminal 16a of the first transistor 16 when the output voltage of the variable power supply 72 increases, and decreases the bias voltage applied to the input terminal 16a of the first transistor 16 when the output voltage of the variable power supply 72 decreases.

The gate bias circuit 74 is implemented by, for example, an inductor.

One end of the gate bias circuit 74 is connected to the variable power supply 72, and the other end of the gate bias circuit 74 is connected to each of the input terminal 20a of the second transistor 20 and the other end of the second input matching circuit 15b.

The gate bias circuit 74 increases the bias voltage applied to the input terminal 20a of the second transistor 20 when the output voltage of the variable power supply 72 increases, and decreases the bias voltage applied to the input terminal 20a of the second transistor 20 when the output voltage of the variable power supply 72 decreases.

Next, an operation of the Doherty amplifier 1 illustrated in FIG. 20 will be described. However, since the components other than the control circuit 71 are similar to those of the Doherty amplifier 1 illustrated in FIG. 3, only the operation of the control circuit 71 will be described here.

The control circuit 71 controls the bias voltage applied to each of the input terminal 16a of the first transistor 16 and the input terminal 20a of the second transistor 20 in accordance with the frequencies of the first signal and the second signal.

Specifically, when the frequency of the first signal and the frequency of the second signal are the first frequency $f_1$ and the operation mode of the Doherty amplifier 1 is the first Doherty operation mode, the control circuit 71 applies the first bias voltage $V_{b1}$ to the input terminal 16a of the first transistor 16. In addition, the control circuit 71 applies the second bias voltage $V_{b2}$ to the input terminal 20a of the second transistor 20.

When the frequency of the first signal and the frequency of the second signal are the fourth frequency $f_4$ and the operation mode of the Doherty amplifier 1 is the second Doherty operation mode, the control circuit 71 applies the second bias voltage $V_{b2}$ to the input terminal 16a of the first transistor 16. In addition, the control circuit 71 applies the first bias voltage $V_{b1}$ to the input terminal 20a of the second transistor 20.

When the frequency of the first signal and the frequency of the second signal are the fifth frequency $f_5$ and the operation mode of the Doherty amplifier 1 is the third Doherty operation mode, the control circuit 71 applies the second bias voltage $V_{b2}$ to the input terminal 16a of the first transistor 16. In addition, the control circuit 71 applies the first bias voltage $V_{b1}$ to the input terminal 20a of the second transistor 20.

When the frequency of the first signal and the frequency of the second signal are the second frequency $f_2$ and the operation mode of the Doherty amplifier 1 is the first outphasing operation mode, the control circuit 71 applies the first bias voltage $V_{b1}$ to each of the input terminal 16a of the first transistor 16 and the input terminal 20a of the second transistor 20.

When the frequency of the first signal and the frequency of the second signal are the third frequency $f_3$ and the operation mode of the Doherty amplifier 1 is the second outphasing operation mode, the control circuit 71 applies the first bias voltage $V_{b1}$ to each of the input terminal 16a of the first transistor 16 and the input terminal 20a of the second transistor 20.

The control circuit 71 controls the bias voltage applied to each of the input terminal 16a of the first transistor 16 and the input terminal 20a of the second transistor 20 in accordance with the respective frequencies of the first signal and the second signal, so that it is possible to increase both the gain and the efficiency of the Doherty amplifier 1.

In the Doherty amplifier 1 illustrated in FIG. 20, the control circuit 71 controls the bias voltage applied to each of the input terminal 16a of the first transistor 16 and the input terminal 20a of the second transistor 20 in accordance with the respective frequencies of the first signal and the second signal.

However, this is merely an example, and the control circuit 71 may control the bias voltage applied to each of the input terminal 16a of the first transistor 16 and the input terminal 20a of the second transistor 20 in accordance with the power of each of the first signal and the second signal output from the signal source 11.

The control circuit 71 increases the bias voltage applied to the input terminal 16a of the first transistor 16 when the power of the first signal output from the first input signal source 12 increases, and decreases the bias voltage applied to the input terminal 16a of the first transistor 16 when the power of the first signal output from the first input signal source 12 decreases.

The control circuit 71 increases the bias voltage applied to the input terminal 20a of the second transistor 20 when the power of the second signal output from the second input signal source 13 increases, and decreases the bias voltage applied to the input terminal 20a of the second transistor 20 when the power of the second signal output from the second input signal source 13 decreases.

The control circuit 71 controls the bias voltage applied to each of the input terminal 16a of the first transistor 16 and the input terminal 20a of the second transistor 20 in accordance with the power of each of the first signal and the second signal output from the signal source 11, so that it is possible to suppress the fluctuation of the gain with respect to the input power in each of the first transistor 16 and the second transistor 20.

Ninth Embodiment

In a ninth embodiment, a Doherty amplifier 1 including a control circuit 81 that controls a bias voltage applied to each of the output terminal 16b of the first transistor 16 and the output terminal 20b of the second transistor 20 will be described.

Figure 21:
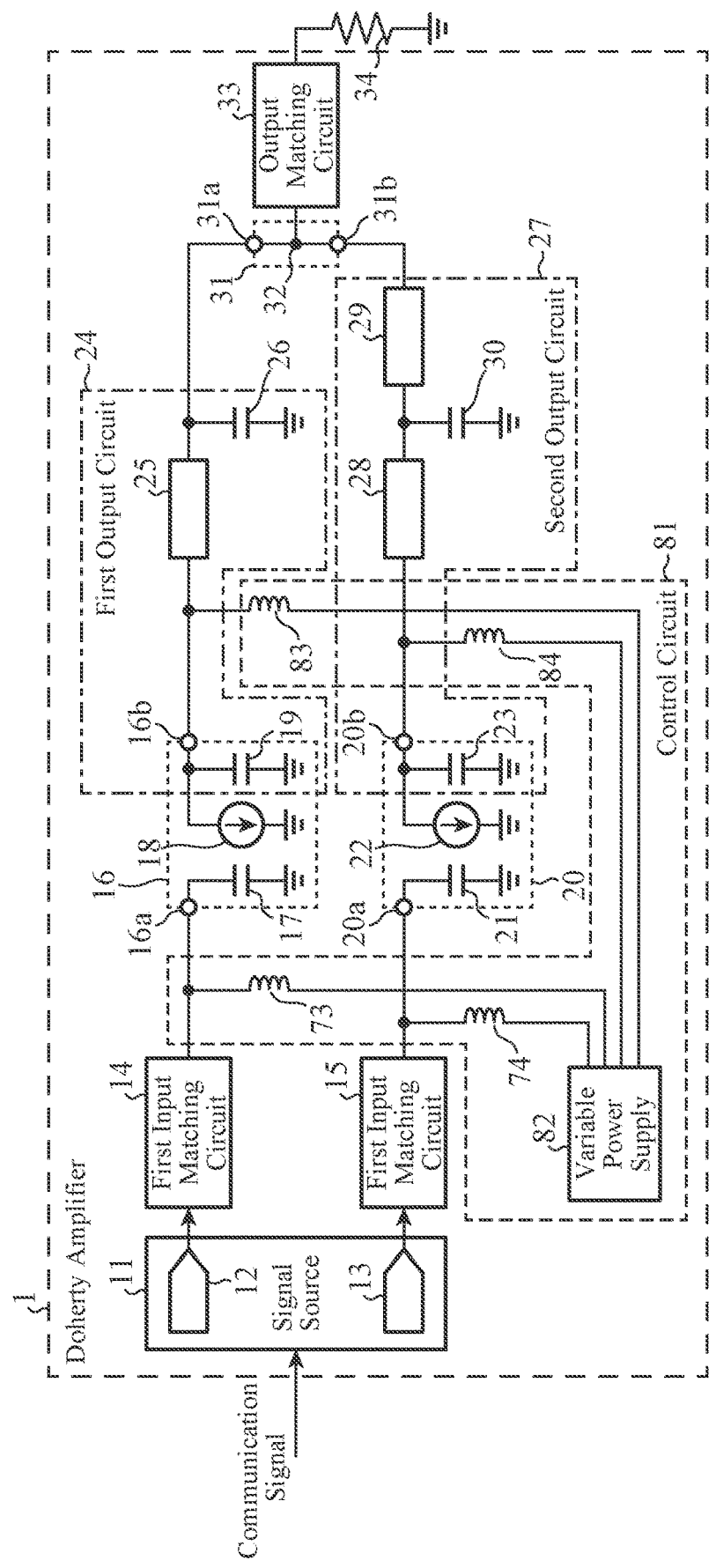
FIG. 21 is a configuration diagram illustrating a Doherty amplifier 1 according to a ninth embodiment.

FIG. 21 is a configuration diagram illustrating the Doherty amplifier 1 according to the ninth embodiment. In FIG. 21, the same reference numerals as those in FIGS. 3 and 20 denote the same or corresponding parts, and thus description thereof is omitted.

The control circuit 81 includes a variable power supply 82, the gate bias circuit 73, the gate bias circuit 74, a drain bias circuit 83, and a drain bias circuit 84.

In the Doherty amplifier 1 illustrated in FIG. 21, the control circuit 81 includes the gate bias circuit 73 and the gate bias circuit 74. However, this is merely an example, and the control circuit 81 may include only the variable power supply 82, the drain bias circuit 83, and the drain bias circuit 84 without including the gate bias circuit 73 and the gate bias circuit 74.

Similarly to the control circuit 71 illustrated in FIG. 20, the control circuit 81 controls the bias voltage applied to each of the input terminal 16a of the first transistor 16 and the input terminal 20a of the second transistor 20.

In addition, the control circuit 81 controls a bias voltage applied to each of the output terminal 16b of the first transistor 16 and the output terminal 20b of the second transistor 20.

The variable power supply 82 is a power supply capable of varying each of the voltage output to the gate bias circuit 73 and the voltage output to the gate bias circuit 74, and capable of varying each of the voltage output to the drain bias circuit 83 and the voltage output to the drain bias circuit 84.

The drain bias circuit 83 is implemented by, for example, an inductor.

One end of the drain bias circuit 83 is connected to the variable power supply 82, and the other end of the drain bias circuit 83 is connected to each of the output terminal 16b of the first transistor 16 and one end of the first transmission line 25.

The drain bias circuit 83 increases the bias voltage applied to the output terminal 16b of the first transistor 16 when the output voltage of the variable power supply 82 increases, and decreases the bias voltage applied to the output terminal 16b of the first transistor 16 when the output voltage of the variable power supply 82 decreases.

The drain bias circuit 84 is implemented by, for example, an inductor.

One end of the drain bias circuit 84 is connected to the variable power supply 82, and the other end of the drain bias circuit 84 is connected to each of the output terminal 20b of the second transistor 20 and one end of the second transmission line 28.

The drain bias circuit 84 increases the bias voltage applied to the output terminal 20b of the second transistor 20 when the output voltage of the variable power supply 82 increases, and decreases the bias voltage applied to the output terminal 20b of the second transistor 20 when the output voltage of the variable power supply 82 decreases.

Next, an operation of the Doherty amplifier 1 illustrated in FIG. 21 will be described. However, since the components other than the control circuit 81 are similar to those of the Doherty amplifier 1 illustrated in FIGS. 3 and 20, only the operation of the control circuit 81 will be described here.

Similarly to the control circuit 71 illustrated in FIG. 20, the control circuit 81 controls the bias voltage applied to each of the input terminal 16a of the first transistor 16 and the input terminal 20a of the second transistor 20.

The control circuit 81 increases the bias voltage applied to the output terminal 16b of the first transistor 16 when the power of the first signal output from the first input signal source 12 increases, and decreases the bias voltage applied to the output terminal 16b of the first transistor 16 when the power of the first signal output from the first input signal source 12 decreases.

The control circuit 81 increases the bias voltage applied to the output terminal 20b of the second transistor 20 when the power of the second signal output from the second input signal source 13 increases, and decreases the bias voltage applied to the output terminal 20b of the second transistor 20 when the power of the second signal output from the second input signal source 13 decreases.

The control circuit 81 controls the bias voltage applied to each of the output terminal 16b of the first transistor 16 and the output terminal 20b of the second transistor 20 in accordance with the power of each of the first signal and the second signal output from the signal source 11, so that it is possible to increase both the gain and the efficiency of the Doherty amplifier 1 in accordance with the input power of each of the first transistor 16 and the second transistor 20.

It should be noted that the invention of the present application can freely combine the embodiments, modify any constituent element of each embodiment, or omit any constituent element in each embodiment within the scope of the invention.

INDUSTRIAL APPLICABILITY

The present invention is suitable for a Doherty amplifier and a communication device that combine an amplified first signal and an amplified second signal.

REFERENCE SIGNS LIST

1: Doherty amplifier, 11: signal source, 12: first input signal source, 13: second input signal source, 14: first input matching circuit, 15: second input matching circuit, 16: first transistor, 16a: input terminal, 16b: output terminal, 17: capacitor, 18: current source, 19: capacitor, 20: second transistor, 20a: input terminal, 20b: output terminal, 21: capacitor, 22: current source, 23: capacitor, 24: first output circuit, 25: first transmission line, 26: first capacitor, 27: second output circuit, 28: second transmission line, 29: third transmission line, 30: second capacitor, 31: combining circuit, 31a: input terminal, 31b: input terminal, 32: combining point, 33: output matching circuit, 34: load, 41: inductor, 42: first transmission line, 43: inductor, 44: second transmission line, 45: third transmission line, 51, 52: transmission line, 53, 54: capacitor, 61, 62, 63: transmission line, 64, 65: capacitor, 71: control circuit, 72: variable power supply, 73, 74: gate bias circuit, 81: control circuit, 82: variable power supply, 83, 84: drain bias circuit

The invention claimed is:

1. A Doherty amplifier, comprising:
a first transistor that amplifies a first signal and outputs an amplified first signal;
a second transistor that amplifies a second signal and outputs an amplified second signal;
a combining circuit that combines the amplified first signal output from the first transistor and the amplified second signal output from the second transistor and outputs a combined signal of the amplified first signal and the amplified second signal; and
a signal source that switches a signal mode between a first signal mode in which the first signal amplified by the first transistor and the second signal amplified by the second transistor are combined in phase and a second signal mode in which the first signal amplified by the first transistor and the second signal amplified by the second transistor are combined out of phase in accordance with a frequency, and
wherein
an operation mode is switched to a Doherty operation mode or an outphasing operation mode depending on the signal mode,
wherein the operation mode when an amplitude of the first signal amplified by the first transistor is equal to or larger than an amplitude of the second signal amplified by the second transistor, and a difference between a phase of the first signal amplified by the first transistor and a phase of the second signal amplified by the second transistor is constant is a first Doherty operation mode, and
wherein the operation mode when an amplitude of the first signal amplified by the first transistor is the same as an amplitude of the second signal amplified by the second transistor, a phase of the first signal amplified by the first transistor is opposite to a phase of the second signal amplified by the second transistor, and a difference between the phase of the first signal amplified by the first transistor and the phase of the second signal amplified by the second transistor monotonically decreases with an increase in a current of a combined signal output from the combining circuit is a first outphasing operation mode.

2. The Doherty amplifier according to claim 1, wherein the operation mode when the signal source generates the first signal and the second signal so that an amplitude of the first signal amplified by the first transistor is the same as an amplitude of the second signal amplified by the second transistor, a phase of the first signal amplified by the first transistor is opposite to a phase of the second signal amplified by the second transistor, and a difference between the phase of the first signal amplified by the first transistor and the phase of the second signal amplified by the second transistor monotonically increases with an increase in a current of a combined signal output from the combining circuit is a second outphasing operation mode.

3. The Doherty amplifier according to claim 1, wherein the operation mode when the signal source generates the first signal and the second signal so that an amplitude of the first signal amplified by the first transistor is equal to or less than an amplitude of the second signal amplified by the second transistor, a difference between a phase of the first signal amplified by the first transistor and a phase of the second signal amplified by the second transistor is constant, and a frequency is lower than a frequency in the first Doherty operation mode is a second Doherty operation mode.

4. The Doherty amplifier according to claim 1, wherein the operation mode when the signal source generates the first signal and the second signal so that an amplitude of the first signal amplified by the first transistor is equal to or less than an amplitude of the second signal amplified by the second transistor, a difference between a phase of the first signal amplified by the first transistor and a phase of the second signal amplified by the second transistor is constant, and a frequency is higher than a frequency in the first Doherty operation mode is a second Doherty operation mode.

5. The Doherty amplifier according to claim 1, wherein in the first Doherty operation mode,
each of a frequency of the first signal amplified by the first transistor and a frequency of the second signal amplified by the second transistor is a first frequency,
each of an amplitude of the first signal output from the signal source to the input terminal of the first transistor and an amplitude of the second signal output from the signal source to the input terminal of the second transistor monotonically increases with an increase in a voltage of the combined signal output from the combining circuit, and an amplitude of the first signal when an amplitude of the second signal is zero is larger than zero,
an output power of the first transistor is a saturated power when an amplitude of the first signal is maximum, and an output power of the second transistor is a saturated power when an amplitude of the second signal is maximum, and a phase of the first signal output from the signal source to the input terminal of the first transistor is advanced by 90 degrees from a phase of the second signal output from the signal source to the input terminal of the second transistor.

6. The Doherty amplifier according to claim 5, wherein in the first outphasing operation mode, each of a frequency of the first signal amplified by the first transistor and a frequency of the second signal amplified by the second transistor is a second frequency lower than the first frequency, each of an amplitude of the first signal output from the signal source to the input terminal of the first transistor and an amplitude of the second signal output from the signal source to the input terminal of the second transistor monotonically increases with an increase in a current of a combined signal output from the combining circuit, and the amplitude of the first signal has the same value as the amplitude of the second signal, an output power of the first transistor is a saturated power when the amplitude of the first signal is maximum, and an output power of the second transistor is a saturated power when the amplitude of the second signal is maximum, a phase of the first signal output from the signal source to the input terminal of the first transistor monotonically decreases with an increase in a current of a combined signal output from the combining circuit, a phase of the second signal output from the signal source to the input terminal of the second transistor monotonically increases with an increase in a current of a combined signal output from the combining circuit, and a phase of the first signal and a phase of the second signal are equal in an absolute value and different from each other in a sign.

7. The Doherty amplifier that switches to the second outphasing operation mode out of the Doherty amplifier according to claim 5, wherein in the second outphasing operation mode, each of a frequency of the first signal amplified by the first transistor and a frequency of the second signal amplified by the second transistor is a third frequency higher than the first frequency, each of an amplitude of the first signal output from the signal source to the input terminal of the first transistor and an amplitude of the second signal output from the signal source to the input terminal of the second transistor monotonically increases with an increase in a current of a combined signal output from the combining circuit, and the amplitude of the first signal has the same value as the amplitude of the second signal, an output power of the first transistor is a saturated power when the amplitude of the first signal is maximum, and an output power of the second transistor is a saturated power when the amplitude of the second signal is maximum, a phase of the first signal output from the signal source to the input terminal of the first transistor monotonically increases with an increase in a current of a combined signal output from the combining circuit, a phase of the second signal output from the signal source to the input terminal of the second transistor monotonically decreases with an increase in a current of a combined signal output from the combining circuit, and a phase of the first signal and a phase of the second signal are equal in an absolute value and different from each other in a sign.

8. The Doherty amplifier that switches to the second Doherty operation mode out of the Doherty amplifier according to claim 6, wherein in the second Doherty operation mode, each of a frequency of the first signal amplified by the first transistor and a frequency of the second signal amplified by the second transistor is a fourth frequency lower than the second frequency, each of an amplitude of the first signal output from the signal source to the input terminal of the first transistor and an amplitude of the second signal output from the signal source to the input terminal of the second transistor monotonically increases with an increase in a voltage of the combined signal output from the combining circuit, and the amplitude of the second signal when the amplitude of the first signal is zero is larger than zero, an output power of the first transistor is a saturated power when the amplitude of the first signal is maximum, and an output power of the second transistor is a saturated power when the amplitude of the second signal is maximum, and a phase of the first signal output from the signal source to the input terminal of the first transistor is advanced by 45 degrees from a phase of the second signal output from the signal source to the input terminal of the second transistor.

9. The Doherty amplifier that switches to the third Doherty operation mode out of the Doherty amplifier according to claim 7, wherein in the third Doherty operation mode, each of a frequency of the first signal amplified by the first transistor and a frequency of the second signal amplified by the second transistor is a fifth frequency higher than the third frequency, each of an amplitude of the first signal output from the signal source to the input terminal of the first transistor and an amplitude of the second signal output from the signal source to the input terminal of the second transistor monotonically increases with an increase in a voltage of the combined signal output from the combining circuit, and the amplitude of the second signal when the amplitude of the first signal is zero is larger than zero, an output power of the first transistor is a saturated power when the amplitude of the first signal is maximum, and an output power of the second transistor is a saturated power when the amplitude of the second signal is maximum, and a phase of the first signal output from the signal source to the input terminal of the first transistor is advanced by 135 degrees from a phase of the second signal output from the signal source to the input terminal of the second transistor.

10. The Doherty amplifier according to claim 1, further comprising:

a first output circuit that transmits the amplified first signal output from the first transistor to the combining circuit; and a second output circuit that has an electrical length longer than an electrical length of the first output circuit and transmits the amplified second signal output from the second transistor to the combining circuit, wherein the first output circuit modulates impedance seeing the combining circuit from the first transistor in accordance with a frequency of the first signal amplified by the first transistor, and the second output circuit modulates impedance seeing the combining circuit from the second transistor in accordance with a frequency of the second signal amplified by the second transistor, wherein the first output circuit includes:

a first transmission line having one end connected to an output terminal of the first transistor and another end connected to a first input terminal of the combining circuit, and having an electrical length of less than 90 degrees; and a first capacitor connected to the first transmission line and a shunt, and the second output circuit includes:

a second transmission line having one end connected to an output terminal of the second transistor and having an electrical length of less than 90 degrees;

a third transmission line having one end connected to another end of the second transmission line and another end connected to a second input terminal of the combining circuit, and having an electrical length of 90 degrees; and a second capacitor connected to the second transmission line and a shunt, wherein a characteristic impedance of the first transmission line is higher than an output resistance of the first transistor, a characteristic impedance of the second transmission line is higher than an output resistance of the second transistor, a capacitance of the first capacitor is the same as an output capacitance of the first transistor, and a capacitance of the second capacitor is the same as an output capacitance of the second transistor.

11. The Doherty amplifier according to claim 1, wherein a bias voltage same as a threshold voltage is applied to each of an input terminal of the first transistor and an input terminal of the second transistor.

12. The Doherty amplifier according to claim 1, wherein a bias voltage higher than the threshold voltage and lower than a first threshold voltage is applied to an input terminal of the first transistor, and the first threshold voltage is higher than the threshold voltage.

13. The Doherty amplifier according to claim 1, wherein a bias voltage higher than the threshold voltage and lower than a first threshold voltage is applied to an input terminal of the second transistor, and the first threshold voltage is higher than the threshold voltage.

14. The Doherty amplifier according to claim 1, wherein a bias voltage lower than the threshold voltage and higher than a second threshold voltage is applied to an input terminal of the first transistor, and the second threshold voltage is lower than the threshold voltage.

15. The Doherty amplifier according to claim 1, wherein a bias voltage lower than the threshold voltage and higher than a second threshold voltage is applied to an input terminal of the second transistor, and the second threshold voltage is lower than the threshold voltage.

16. A communication device comprising the Doherty amplifier according to claim 1 as an amplifier that amplifies each of the first signal and the second signal as a communication signal.

* * * * *